United States Patent [19]

Simmons et al.

[11] Patent Number: 4,800,415

[45] Date of Patent: Jan. 24, 1989

[54] BIPOLAR INVERSION CHANNEL DEVICE

[75] Inventors: John G. Simmons, Bethlehem, Pa.; Geoffrey W. Taylor, Berkeley Heights, N.J.

[73] Assignee: American Telephone and Telegraph Company, AT&T Bell Laboratories, Murray Hill, N.J.

[21] Appl. No.: 9,620

[22] Filed: Jan. 22, 1987

Related U.S. Application Data

[63] Continuation of Ser. No. 653,440, Sep. 21, 1984, abandoned.

[51] Int. Cl.$^4$ .................. H01L 29/72; H01L 29/161; H01L 49/02; H01L 29/80
[52] U.S. Cl. ....................................... 357/34; 357/16; 357/6; 357/22; 357/38; 357/17; 357/30
[58] Field of Search ................ 357/16, 6, 22 A, 22 E, 357/34, 38, 17, 30 E, 30 B

[56] References Cited

U.S. PATENT DOCUMENTS

| 2,569,347 | 9/1951 | Shockley | 332/52 |
| 2,764,642 | 9/1956 | Shockley | 179/171 |
| 4,326,208 | 4/1982 | Fang et al. | 357/16 |
| 2,744,9706 | 5/1956 | Shockley | 179/171 |

FOREIGN PATENT DOCUMENTS 0084393  1/1983  European Pat. Off. ...... 357/22 MD

OTHER PUBLICATIONS

Katz, J. et al., "A Monolithic Integration of a Ga/As/-GaAlAs Bipolar Transistor and Heterostructure Laser" Appl. Phys. Lett. 37(2), 15 Jul. 1980 pp. 211–213.
"A Comparision of Semiconductor Devices for High--Speed Logic", *Proceedings of the IEEE*, vol. 70, No. 5, P. M. Solomon, May 1982, pp. 489–509.
"(Invited) A SIPOS-Si Heterojunction Transistor", *Japanese Journal of Applied Physics*, vol. 20 (1981) Supplement 20-1, pp. 75–81.
"(Invited) Heterostructures for Everything: Device Principle of the 1980's?", *Japanese Journal of Applied Physics*, vol. 20 (1981) Supplement 20-1, pp. 9–13.
"Tunneling Hot Electron Transfer Amplifiers (THETA); Amplifiers Operating up to the Infrared", *Solid-State Electronics*, vol. 24, M. Heiblum, 1981, pp. 343–366.
"A Silicon Heterojunction Transistor", 1979*American Institute of Physics*, Appl. Phys. Lett. 35(7), T. Matsushita et al., Oct. 1979, pp. 549–550.
"A New Field-Effect Transistor with Selectively Doped GaAs/n-Al$_x$Ga$_{1-x}$As Heterojunctions", *Japanese Journal of Applied Physics*, vol. 19, No. 5, T. Mimura et al, May 1980, pp. L225–L227.
"Super-Gain Silicon MIS Heterojunction Emitter Transistors", IEEE *Electron Device Letters*, vol. ED-L-4, No. 7, M. A. Green, Jul. 1983, pp. 225–227.
"Consideration of the Relative Frequency Performance Potential of Inverted Heterojunction n-p-n Transistors", *IEEE Electron Device Letters*, vol. EDL-5, No. 3, C. G. Fonstad, Mar. 1984, pp. 99–100.
"High Injection Efficiency Transistor", Department of the Navy, Office of Naval Research, Contract No. N00014-80-C-0681, Jul. 1982, pp. 1–60.
"The Tunnel Emission Amplifier", *Proceedings of the IRE*, Mar. 1960, pp. 359–361.
"The Space-Charge-Limited Dielectric Triode", *Solid-State Electronics*, Pergamon Press vol. 5, G. T. Wright, 1962, pp. 117–126.
"Heterostructure Bipolar Transistors and Integrated Circuits", *Proceedings of the IEEE*, vol. 70, No. 1, H. Kroemer, Jan. 1982, pp. 13–25.
"A New Silicon Heterojunction Transistor Using the Doped Sipos", *Electron Devices Meeting*, H. Hayashi et al, 1979, pp. 522–525.
"Silicon Speeds Could Top 1 GHz", *Electronics*, L. Waller, Aug. 25, 1982, pp. 48–49.
"An n-In$_{0.47}$As/n-InP Rectifier", *American Institute of Physics*, J. Appl. Phys. 52(9), S. R. Forrest et al, Sep. 1981, pp. 5838–5842.
"The GaAs P-N-P-N Laser Diode", *IEEE Journal of Quantum Electronics*, vol. QE-10, No. 7, K. F. Etzold et al, Jul. 1974, pp. 567–569.
Proceedings of the European Solid State Device Research Conference, Sep. 1981, Toulouse, France as published in *Solid State Devices*, pp. 86–111 (1981).
"A 500V Monolithic Bidirection 2×2 Crosspoint Array", IEEE ISSCC1980, Feb. 14, 1980; pp. 170–171,P. W. Shackle et al, Bell Labs.

"A New Bidirectional Solid-State Switch for Telephone Loop Plant Applications", P. W. Shackle et al, Proceedings of the IEEE, vol. 69, No. 3, Mar. 1981, pp. 292-299.

"The Hot Electron Triode with Semiconductor-Metal Emitter", NEREM Record, Session 21: Thin-Film Amplifiers, M. M. Atalla, Nov. 7, 1962, pp. 162-163.

*Primary Examiner*—Martin H. Edlow
*Assistant Examiner*—Robert P. Limanek
*Attorney, Agent, or Firm*—James H. Fox

[57] ABSTRACT

A new solid state field effect bipolar device provides for high current gain and low input capacitance, while avoiding the "punch-through" effects that limit the downward scaling of conventional bipolar and field effect devices. The device typically comprises a metallic (e.g. a metal or silicide) emitter, which makes ohmic contact to a semi-insulator; a channel terminal which contacts an inversion layer formed at the interface between the semi-insulator and a semiconductor depletion region; and a collector, which is the semiconductor bulk. The novel device controls the flow of majority carriers from the emitter into the collector by the biasing action of charge in the inversion channel. The technique can be utilized in making a transistor, photodetector, thyristor, controlled optical emitter, and other devices.

52 Claims, 25 Drawing Sheets

BIPOLAR INVERSION CHANNEL DEVICE

This application is a continuation, of application Ser. No. 653,440, filed Sept. 21, 1984, abandoned.

BACKGROUND OF THE INVENTION

1. Field of the Invention

The present invention relates to a device structure suitable for transistors, thyristors, optical emitters, optical detectors, and other solid state devices.

2. Description of the Prior Art

The speed of operation and transconductance are two properties of transistors that device designers are endlessly seeking to increase, in order to obtain superior performance. Generally speaking, from the first practical implementation of the bipolar and field effect transistors in the 1950's and early 1960's, the major advances in device performance have resulted from technological inovation. The principles of operation have remained unchanged, but the physical sizes of the devices have been reduced at a steady rate towards smaller geometries. The progression towards miniaturization has been due to advances in lithography, processing technology, and improvement in device structural design.

Initially the bipolar transistor was the superior high-speed device, while the field effect transistor (FET) was more useful for low-speed/low-power applications. With continued scaling however, the FET has shown the ability to outperform bipolar transistors for very high speed and very high density circuits. The field effect transistor is frequently implemented as a metal-oxide semiconductor (MOS) structure, although other forms are possible. The advantages of the bipolar vis-a-vis the MOS are its higher transconductance ($g_m$) and its higher current gain. However, to compare logic circuit performance one also has to consider the ratio of transconductance to capacitance ($g_m/C$). In this regard, MOS technology benefits distinctly compared to bipolar technology as device geometries are reduced, because in MOS devices, capacitances are more amenable to scaling. This is because the shrinking of vertical dimensions in the MOS (junction depth and oxide thickness) is more easily accomplished than in the bipolar (emitter depth and base width).

The endless thrust to ever-decreasing device geometries leads to problems in both bipolar and field effect transistors, with one serious problem encountered by either device being the punchthrough effect. In the bipolar transistor, punchthrough occurs when the collector merges with the emitter, and in the field effect transistor when the drain and source depletion regions begin to merge. In both cases the characteristics change from the pentode-like to the triode-like form, which degrades inverter performance and eventually leads to complete loss of control of the base or gate, as the case may be.

For the last 25 years bipolar and field effect transistors have been the dominant device forms because of their proven abilities, although from time-to-time various other devices have been proposed. In particular, considerable interest has been shown in hot-electron devices—e.g., the tunnel-transistor (or MOM OM), the semiconductor-metal-semiconductor transistor, and the space-charge-limited transistor—because of their potential for high-speed operation. However, for various reasons, none of these devices have proved viable. Nevertheless, the basic concept of a device operating in the collision-free mode has its attractions.

Since the limits of performance of field effect and bipolar devices are looming ominously closely, there is a pressing need to consider new concepts to circumvent the basic limits of these devices. Any new device would desirably have at least some of the following characteristics:

I. have a transconductance and current gain equal to, or better than, the conventional bipolar transistor;
II. have a figure of merit ($g_m/C$) better than state-of-the-art bipolar or field effect transistors;
III. be immune to punchthrough effects;
IV. be integrable to a useful level of circuit complexity,
V. permit fabrication of logic and memory circuits with power/delay products superior to state-of-the-art circuits;
VI. be able to attain transit times that are not restricted solely by the lithographic capability;
VII. be free of the scaling limitations on existing devices.

Thus, it is desirable to obtain a device that combines the virtues of the bipolar and MOS concepts; namely one which has high current gain and high transconductance coupled with relatively simple fabrication requirements and low charge storage.

SUMMARY OF THE INVENTION

We have invented a solid state device wherein an inversion layer controls the flow of electrical carriers between two regions. The device is designated in one illustrative embodiment of the Bipolar Inversion Channel Metallic Emitter Transistor (BICMET), which comprises a metallic emitter in ohmic contact to a wider bandgap region; a narrower bandgap collector region; and a channel contact, which contacts an inversion layer formed at the interface between the wider bandgap region and the narrower bandgap region. Other regions can be added to obtain other devices, including thyristors, optical emitters, etc. The principle of operation is based on controlling the flow of majority carriers from the emitter to the collector by the biasing action of charge in the inversion layer, which can provide for current gain. A conversion of photons to hole-electron pairs can be obtained, producing an optical detector.

DETAILED DESCRIPTION

The following detailed description relates to a new solid state device, which we designate in one embodiment the BICMET, Bipolar Inversion Channel Metallic Emitter Transistor.

Physical Structure

Figure 1:
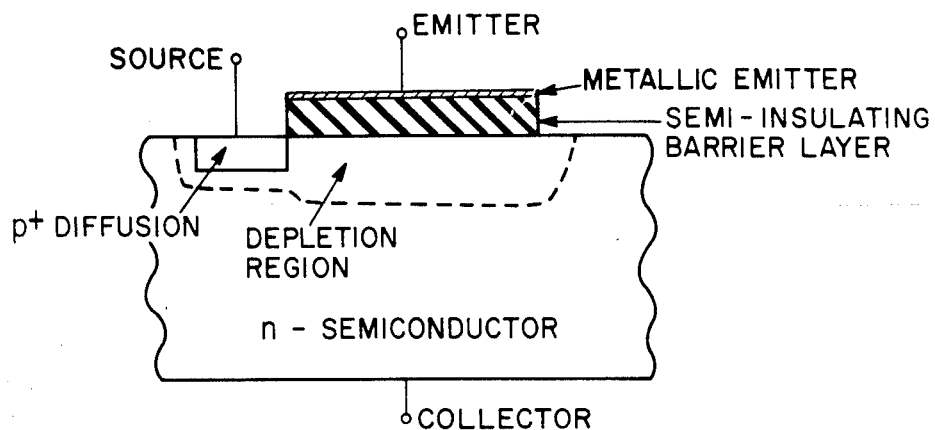
FIG. 1 shows a cross-section of one embodiment of the BICMET; the regions are not to scale, with the barrier layer (wider bandgap region) being shown thick for illustrative purposes.

An illustrative physical structure of the BICMET is shown in FIG. 1. The discussion that follows, we will consider the "p-channel" device, wherein a p-type inversion layer is formed at the interface between n-type materials. The "n-channel" device is analogous, with the conductivity types being reversed. However, the terms "minority carriers" and "majority carriers" are generic to both device types. Electrons are designated the majority carriers, and holes the minority carriers, in the p-channel device, since the bulk of the material is n-type. For consistency, this designation is maintained in the inversion layer as well, even though it has p-type conductivity. These designations are of course reversed for the n-channel devices. This designation scheme implies that the minority carriers are of a different conductivity type than the majority carriers in a given device. The term "bandgap" refers to the difference in energy levels between the valence band and the conduction band for the material of a given region of the device.

The p-channel BICMET comprises an n-type relatively narrower bandgap material, which is designated the "collector". In one configuration, referred to as "emitter up", the collector is formed in a supporting substrate, which may be a semiconductor wafer for an epitaxial layer formed thereon. Contacting a surface of the narrower bandgap region is an n-type relatively wider bandgap region which is sufficiently thin to permit thermionic carrier transport through the film, but sufficiently thick to prevent tunneling. A metallic layer, referred to as the "emitter" contacts this region, with the wider bandgap region separating the metallic emitter from the collector. A metallic emitter is used because a semiconductor is not really a very efficient emitter; it is, in fact, a limited source of carriers and, invariably, its resistance becomes a dominant factor at high current levels. On the other hand, a metal, with its almost infinite supply of carriers, its low resistance, and its inability to store charge, has all the basic features of the ideal emitter. The problem, of course, is to achieve a structure that will incorporate a metal to take advantage of these features. In the present structure, the metallic layer also serves to create or enhance an inversion layer thereunder, by means of the field effect between the metallic layer and the collector. By aligning the edge of the metal layer to a "source", discussed below, this field effect thus creates or enhances electrical access to the inversion layer, for control purposes. As discussed below, the metal layer may be formed in electrically isolated segments, with a peripheral portion serving to control access to the inversion layer, and another portion serving as the emitter. These portions may be overlapped slightly and isolated by a dielectric to ensure a continuous inversion layer.

In the p-channel BICMET, a p+-well, adjacent to the metallic emitter, provides electrical access to the inversion layer, also referred to as the "inversion channel" herein. This access well is designated the "channel contact" herein; it is alternately referred to for explanatory purposes as the "source". This is because the channel contact serves as the the source of minority carriers that control the flow of majority carriers across the inversion layer. An "inversion layer" can also be referred to as a "two-dimensional gas", although not all two-dimensional gases exhibit inversion. The p-channel BICMET thus has a two-dimensional hole gas, and the n-channel BICMET has a two-dimensional electron gas, in the inversion layer. Note that the term "electrical contact" as used with regard to the source implies that the inversion layer is supplied with minority carriers that flow directly from the source, and thereby control the flow of majority carriers from emitter to collector. This implies that the control carriers (in the inversion layer) are of opposite conductivity type as the controlled carriers (flowing from emitter to collector). This is in contrast, for example, to an enhancement mode field effect transistor operating in the common gate configuration. In that case, the controlled carriers flowing from source to drain are identical with the control carriers flowing from the source (into the inversion channel), and hence both control and controlled carriers are of the same conductivity type. As used herein, the term "operating electrical potential" refers to the application of a voltage to the emitter and collector that tends to cause majority carriers to flow from emitter to collector. The absence of any externally applied electrical potentials to the source, emitter, and collector is referred to as the "quiescent" state herein, and the device is also referred to then as being in "equilibrium".

Energy Band Diagram

Figure 2:
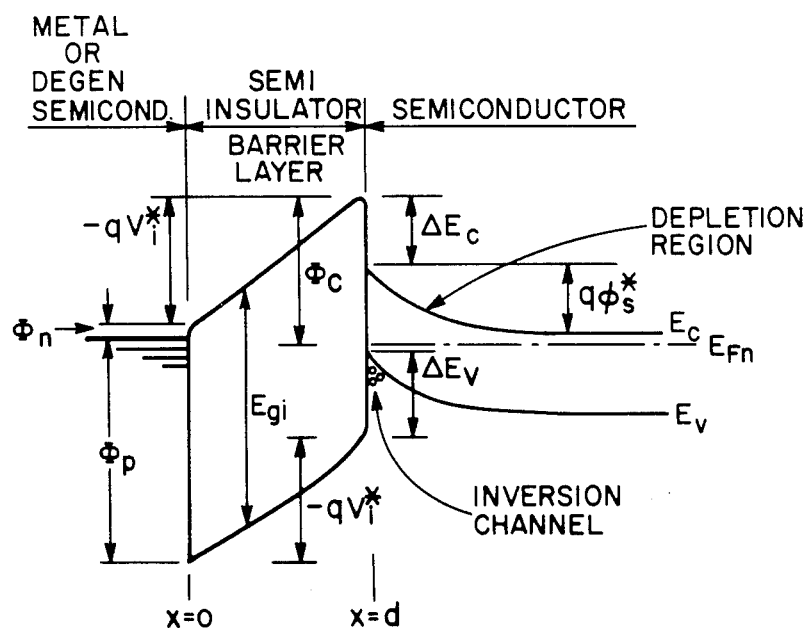
FIG. 2 shows the zero bias (i.e., equilibrium) energy diagram of a p-channel BICMET.

The energy band requirements of the BICMET under equilibrium conditions are illustrated in the energy diagram of FIG. 2. In the interests of clarity, we herein also refer to the wider bandgap (thin-film barrier layer) material as a "semi-insulator" and the narrower bandgap material as a "semiconductor", although neither may necessarily fall within the accepted definition of these materials—e.g., they could both be two semiconductors or two semi-insulators. Furthermore, these terms do not imply resistivity differences, since either may have a larger resistivity than the other, or they may have comparable resistivities. In addition, the terms "narrower bandgap" and "wider bandgap" are defined for material in the vicinity of the inversion layer. This is because the bandgaps can be graded in either region away from the inversion layer, as by a change in crystal composition or doping levels, as explained further below. For purposes of analysis, the semiconductor material is assumed to be sufficiently thick that it accommodates the depletion layer formed at its surface under operating bias. On the other hand, the semi-insulator is assumed to be sufficiently thin that: (a) the electric fields within it are essentially constant; (b) that electrons and holes pass through without substantial scattering—that is, conduction processes are thermionic; and (c) recombination and space charge effects are negligible. Typical thicknesses of the semi-insulator range from 70 angstroms to 1000 angstroms, and more typically 150 to 400 angstroms.

The symbols utilized herein are defined in the Table, below. Note that * as a superscript denotes an equilibrium value.

| LIST OF SYMBOLS | |
|---|---|
| A | device area. |
| $A^*$ | Richardson's constant ($\simeq 120$ amp cm$^2$/degree K$^2$). |
| $C_i$ | capacitance of the semi-insulating layer. |
| d | thickness of the semi-insulating layer. |
| $D_p, D_n$ | hole (electron) diffusion constant in the n-type (p-type) semiconductor region. |
| $E_{Fn}$ | Fermi level in n-type semiconductor bulk. |
| $\Delta E_{Fn}$ | energy difference between Fermi level and conduction bond in n-type semiconductor. |
| $E_c, E_v, E_{ci}, E_{vi}$ | conduction (valence) band energies in the semiconductor and in the semi-insulator, respectively. |
| $E_g, E_{gi}$ | band gap energies of the semiconductor and semi-insulator, respectively. |
| $E_i^*$ | equilibrium electric field in the semi-insulator ($=-V_i/d$). |
| $\epsilon_s$ | semiconductor dielectric constant. |
| G | dc current gain of the BICMET. |
| $I_C, I_E, I_S$ | collector, emitter, source currents, respectively. |
| $J_{pc}, I_{pc}$ | hole current flow component from source to collector (density and total current respectively). |
| $J_{pi}, I_{pi}$ | hole current density and total hole current in the semi-insulator. |
| $J_g, I_g$ | generation current density and current (respectively) in the collector depletion region. |
| $J_{ni}, I_{ni}$ | electron current density and total electrical current in the semi-insulator. |
| $J_E$ | emitter current density. |
| $J_C$ | collector current density. |
| $L_p$ | hole diffusion length in the n-type semiconductor. |
| $m_e$ | effective mass of an electron. |
| $N_c$ | density of states in the conduction band of the semi-insulator, or semiconductor (assumed the same for convenience). |
| $N_v$ | density of states in the valence band of the semi-insulator, or the semiconductor (assumed the same for convenience). |
| $N_d, N_{di}$ | donor concentration in the semiconductor and semi-insulator, respectively. |
| $n_i$ | semiconductor intrinsic carrier concentration. |
| $\phi_s$ | voltage band-bending of the semiconductor depletion region. |
| $2\phi_F$ | twice the equilibrium Fermi energy in the bulk semiconductor. |
| $\Phi_c = -gV_i^* + \Phi_n$ | electron barrier height at the semiconductor semi-insulator interface. |

-continued

| LIST OF SYMBOLS | |
|---|---|
| $\Phi_n$ | small barrier for electrons at the metal semi-insulator interface. |
| $\Phi_p$ | energy barrier for holes at the semiconductor semi-insulator interface. |
| $\Delta E_c, \Delta E_v$ | conduction (valence) band edge discontinuity between semiconductor and semi-insulating barrier; see FIG. 2. |
| $\phi_s^*$ | equilibrium surface potential of the semiconductor. |
| $\Delta\phi_s$ | change in surface potential of the semiconductor under bias. |
| $-qV_i^* = \Phi_c - \Phi_n$ | voltage drop in the semi-insulator with zero bias applied. |
| $p_o$ | surface concentration of holes (cm$^{-3}$). |
| $p_{no}$ | bulk concentration of holes in the n-type semiconductor. |
| $p_o^*$ | equilibrium concentration of holes at the semiconductor surface. |
| $p(x_d)$ | hole carrier concentration at the edge of the depletion region. |
| $Q_s$ | charge per unit area in the semiconductor with bias applied. |
| $Q_s^*$ | charge per unit area in the semiconductor with no bias applied. |
| q | electronic charge. |
| $Q_i, Q_i^*$ | immobile charge per unit area, and equilibrium immobile charge per unit area, at the semiconductor interface. |
| $Q_{inv}, Q_{inv}^*$ | mobile charge per unit area and equilibrium mobile charge per unit area in the semiconductor. |
| $Q_d$ | depletion charge per unit area in the semiconductor. |
| $Q_{st}$ | total stored charge per unit area ($=Q_s-Q_s^*$) in the BICMET under bias. |
| $Q_{sti}$ | stored mobile charge per unit area ($=Q_i-Q_i^*$) in the BICMET under bias. |
| $R_{oe}$ | common emitter output resistance. |
| $\tau_g$ | generation lifetime of the semiconductor. |
| $V_s$ | saturation velocity (taken to be $\simeq 10^7$ cm/sec for Si-SIPOS interface or the the AlGaAs–GaAs interface). |
| $v_{tp}, v_{tn}$ | thermal velocity of holes, electrons (respectively), in the semi-insulator. |
| $V_i, V_i^*$ | voltage and equilibrium voltage across the semi-insulating barrier layer. |
| $\Delta V_i$ | $V_i-V_i^*$ |
| $V_{SC}$ | source-collector voltage. |
| $V_{SE}$ | source-emitter voltage. |
| $V_{CE}$ | collector-emitter voltage. |
| $x_d$ | collector depletion width. |
| $\beta$ | q/kT |
| k | Boltzmann's constant. |
| T | absolute temperature. |
| $\epsilon_p$ | energy of acceptor level above valence band. |
| $\Delta E_i, \Delta E_i^*$ | position and equilibrium position and equilibrium position Fermi level with respect to the valence band. |

The most striking feature of the BICMET is that the collector depletion region extends substantially to the semi-insulator interface, typically even without bias; i.e., even in the quiescent state. The energy level of the conduction band of the semiconductor is continuously increasing as the surface is approached, and there is an inverted layer at the surface. As used herein, the term "inversion" refers to a field-induced layer at the surface of the semiconductor that interfaces with the semi-insulator, which layer is of opposite conductivity type to that of the bulk of the semiconductor. In a typical embodiment, the absolute value of the surface potential ($\phi_s^*$) is greater than twice the Fermi level ($2\phi_F$) of the semiconductor bulk with no bias voltages applied, resulting in an energy band configuration similar to an ideal MOS depletion transistor. The formation of the inversion layer is typically accomplished in part by charge deposition (e.g., ion implantation, molecular beam epitaxy, or other impurity doping methods). The depth of deposited charge from the interface is typically less than 100 angstroms for the deposited charge density of $10^{19}$ carriers/cm$^3$. However, greater depths are possible, as long as the deposition region remains electrically depleted of charge carriers. It can also be accomplished at least in part by choosing the wide and narrow bandgap materials to have sufficiently different work functions, that is, different Fermi levels, so that inversion occurs. (The materials shown herein have approximately comparable Fermi levels, so that the use of charge deposition is described below.) However, the inversion can also be accomplished totally or in part by short channel effects or operating bias, discussed further below. The discontinuity between the valence bands, or between the conduction bands, due to the difference in the bandgaps of the material on either side of the inversion layer, provides for confinement of the inversion charge. For this purpose, the difference in the valence band energies ($\Delta E_v$) for the p-channel BICMET, or in the conduction band energies ($\Delta E_c$) for the n-channel BICMET, is at least 0.025 electron volts. For example, we estimate that a difference of 0.05 electron volts provides for retaining about 87 percent of the inversion charge in the inversion layer.

Therefore, the BICMET is significantly different from the heterojunction transistor, which is simply a bipolar junction transistor with the base-emitter p-n junction replaced by a heterojunction (i.e., a junction between two semiconductors having different bandgap energies). Consequently the heterojunction transistor typically has the problems associated with the bipolar junction transistor and, in addition, a severe problem with recombination at the heterojunction interface due to unavoidable lattice mismatches. The BICMET, on the other hand, has no base as such, being comprised of two contacting layers of the same type (e.g., n-type), as opposed to three semiconductor layers in bipolar junction transistors and heterojunction bipolar junction transistors. While the inversion layer of the BICMET may be formed by counter-doping of a semiconductor (e.g., forming a p-layer in an n-material), note that the base of a conventional bipolar transistor is formed to have a quiescent carrier density much greater than the charge injected by the operating bias. For example, the carrier density in the base of a bipolar transistor is typically about $10^{17}$ to $10^{18}$ carriers/cm$^3$, with the injected charge density during operation being typically an order of magnitude less. In contrast, in the BICMET, the density of carriers in the inversion layer during operation is typically at least 10 times, and frequently over 100 times, as great as the quiescent carrier density due to the deposited charge. For example, the inversion layer extends less than 100 angstroms, and typically less than 50 angstroms, from the semiconductor-semi-insulator interface. Hence, an exemplary carrier density of holes ($p_o^*$) of $10^{18}$ carriers/cm$^3$ produces a sheet charge density of only about $3 \times 10^{12}$ carriers/cm$^2$ in an exemplary 30 angstrom thick inversion layer. This is substantially less then the density of charge (holes in the case of the p-channel BICMET) injected from the source into the inversion layer during operation. Furthermore, the operating bias potentials increase the level of inversion, which inherently produces a charge density greater than the background charge.

The resulting quiescent inversion channel is thus supplied with holes from the channel contact when the device is biased. The condition of inversion substantially reduces recombination and trapping of charge in interface states. A reduction of recombination and trapping can also be accomplished by other techniques (e.g., hydrogen annealing in the case of the Si/SIPOS interface), which may reduce the amount of inversion necessary for this purpose. The equilibrium field $E_i^*$ in the semi-insulator is positive; i.e., the equilibrium semi-insulator voltage is negative, $V_i^* < 0$. As noted above, the inversion channel is formed so as to exist at least in part with no bias voltages applied. This can be accomplished by deposited charges at the interface, either in the semiconductor or semi-insulator, or both. Typically, sufficient charge is deposited so that the Fermi level in the inversion layer is within 0.2 electron volts of the valence band for the p-channel BICMET, or within 0.2 electron volts of the conduction band for the n-channel BICMET; most typically those values are within the range of 0.05 to 0.1 electron volts.

The inversion can also be accomplished totally or in part by the short channel effect. This can be induced by making the source-collector junction deeper relative to the channel length, or by making the channel relatively shorter. Then, the depletion regions due to the source-collector p-n junction can extend substantially to the limits of the interface between the semi-insulator and the semiconductor. The electric fields at the depletion region edge can then cause inversion even in the absence of deposited charge at the interface or operating electrical potentials. In fact, at channel lengths on the order of 0.1 micrometer, it is expected that no additional doping (i.e., charge deposition) at the interface is required to achieve inversion. As noted above, the operating electrical potentials also act to increase the inversion charge, and it is possible to achieve inversion totally by the biasing voltage applied to the device. However, this typically results in an increased turn-on voltage ($V_{CE}$, cut-in) that is undesirable in many cases, but may be acceptable or desirable in other cases.

In order to realize the full potential of the BICMET, the channel contact should provide good electrical contact to the inversion layer. This is advantageously obtained by self-alignment of the channel contact to the emitter. Then, the p+ diffusion of the channel contact electrically accesses the inversion layer at the semi-insulator-semiconductor interface; see FIG. 1. It is possible for the metallic emitter to overlap the channel contact to some extent, in order to ensure good electrical access. This can be accomplished, for example, by heating the channel contact region to cause the (P) dopant to diffuse under the edge of the semi-insulating region. However, increasing the overlap causes increased parasitic input capacitance of the device. It is also possible to space the channel contact a short distance from the edge of the semi-insulator; we estimate that distances up to the depletion width associated with the source-collector junction, and perhaps even beyond, may be acceptable before increased resistance effectively eliminates electrical access of the inversion layer from the channel contact. This depletion width is typically on the order of 1000 angstroms. Any barrier between the channel contact and the inversion layer should typically be only a diffusion barrier, and not a field dependent conductivity region. However, it is possible to utilize a field-dependent conductivity region for control purposes. That is, the metal layer can be divided into two (or more) regions, and an additional control electrode (not shown) can contact the region between the source and the emitter contact, as viewed in FIG. 1. These metallic regions can then be somewhat overlapped at their edges and dielectrically isolated, thus isolating the control electrode and the emitter electrode. Then, application of the appropriate voltage to this control electrode can create or enhance the inversion layer thereunder, producing electrical access from the source to the inversion layer under the emitter. Alternately, the application of the opposite voltage to this control electrode can reduce or eliminate such access to an inversion layer otherwise present. Note also that while FIG. 1 shows a single channel contact, additional contacts can be provided around the periphery of the semi-insulator. In fact, a continuous annular channel contact around the semi-insulator can be provided, for improved access to the inversion layer.

In a typical embodiment, the emitter of the BICMET is formed on a different level than the channel contact; see FIG. 1. This allows the channel contact to be separated from the metallic emitter by the semi-insulator, and hence avoids high source-emitter leakage currents. Further, this non-planar geometry allows the source to contact the inversion layer in a self-aligned fashion, as noted above. Note that this geometry is different than the typical planar geometry of bipolar transistors, where a p-n junction isolates the base from the emitter. In an alternate embodiment, referred to as "emitter down", the emitter is formed in the substrate, and the collector is formed on a mesa on the substrate. An emitter contact spaced a short distance from the mesa contacts the emitter, whereas a channel contact on the substrate contacts the inversion layer, as before, still other configurations are possible.

We note that there is a similarity between the source current in the p-channel BICMET and the source (or channel) current of a p-MOS transistor, since both feed the current flowing in the p-channel inversion layer at the semiconductor surface. However, the BICMET does not require a drain, since the source current flows through the semi-insulator to the emitter. This provides the BICMET with two distinct advantages (amongst others) vis-a-vis the MOS transistor, namely: (a) the phenomenon of MOS punchthrough does not exist, which has important scaling implications; (b) the device begins to turn on immediately when channel charge begins to flow; therefore the delay associated with the charge transiting the MOS channel from source to drain is eliminated (although there is a much shorter delay time for the electrons to travel from the emitter to collector of the BICMET, which is a distance typically of the order of 600 angstroms). Because the BICMET does not have the punchthrough constraints of the MOS or bipolar transistors, it may be scaled to much smaller dimensions. In fact, there appear to be no obstacles in scaling the lateral dimensions into the sub 0.1 μm range.

As noted above, the formation of the inversion layer is typically enhanced at smaller dimensions by the "short-channel" effect. Referring to FIG. 1, the depletion region, even in the absence of deposited inversion charge, or an operating electrical potential applied to the device, will extend from the source (P+ diffusion) under the semi-insulator. This is of course due to the usual formation of a depletion region at a p-n junction, as carriers migrate across the junction until electrostatic forces establish an equilibrium with diffusion forces. At smaller device geometries, the source (P+ diffusion) typically becomes deeper relative to the width of the semi-insulator. Hence, the depletion region extends further under the semi-insulator, until at some geometry it extends entirely under the semi-insulator; i.e., it extends to the limits of the semiconductor-semi-insulator interface. Since the inversion layer is approximately co-extensive with the depletion region at the interface, this short-channel effect can by itself produce the desired inversion layer. Of course, the inversion is further enhanced when operating electrical potentials are applied, as noted above.

The function of the semi-insulator is to form a potential barrier to electrons ($\Phi_n - qV_i^*$), and holes ($\Phi_p$) at zero voltage, between the emitter and the collector. Ideally, the emitter/semi-insulator contact should be as close to ohmic as possible, i.e., $\Phi_n$ should be less than 0.1 electron volt, and preferably less than 0.05 electron volt. Note then any contact potential between the metallic emitter and the semi-insulator is transparent to the external circuit, and hence not included in $\Phi_n$. The low "on" resistance of the device allows a saturated collector current density (i.e., when $V_i > V_i$ (on)) of at least $10^6$ A/CM$^2$, and a carrier density of at least $10^{18}$ carriers/cm$^3$ transiting the wider bandgap region. The requirements of these barriers and the practical implementation of the structure will be further discussed below.

Equilibrium Charge and Voltage Distributions

In all of the energy diagrams herein, energy bands sloping upwards to the right as viewed imply a negative voltage drop across that region and hence positive fields, and energy bands that slope downwards in moving to the right imply positive voltage change and negative field. Therefore, for example in FIG. 2, $\phi_s^*$ is a positive quantity and $V_i^*$ is negative. The equilibrium charge relationship for the BICMET is $$Q_e^* + Q_s^* + Q_i^* = 0 \qquad (1)$$

where $Q_e^*$, $Q_s^*$ and $Q_i^*$ are the charge per unit area on the emitter, in the collector (semiconductor) and at the semi-insulator-semiconductor interface. Under equilibrium conditions the surface of the semiconductor is heavily inverted; thus (see equation A3b of the appendices)

$$Q_s^* = \left(\frac{2q\epsilon_s}{\beta}\right)^{\frac{1}{2}} |p_o^* + N_d\beta\phi_s^*|^{\frac{1}{2}} \qquad (2)$$

where $p_o^*$, the equilibrium hole density at the interface, is given by $$p_o^* = N_v e^{-\Delta E_i/kT} = N_v e^{-(E_g - \Delta E_{Fn} - q\phi_s^*)/kT}. \qquad (3)$$

It is worth noting that since the equilibrium field in the semi-insulator is positive, then $Q_e > 0$, and since $Q_s^* > 0$ then from (1) $Q_i^* = -(Q_e^* + Q_s^*)$ so $Q_i^* < 0$ for the energy band configuration shown.

The equilibrium surface potential $\phi_s^*$ and semi-insulator voltage $V_i^*$ are related as follows:

$$V_i^* + \phi_s^* = \frac{\psi_{ms}}{q} \qquad (4)$$

where $\Psi_{ms}$ is the difference in work functions of the metal ($\Psi_m$) and semiconductor ($\Psi_s$):

$$\Psi_{ms} = \Psi_m - \Psi_s. \tag{5}$$

$_i^*$ and $\phi_s^*$ are related to $\Phi_n$ and $\Phi_p$ by $$\Phi_n = \Delta E_{Fn} + \Delta E_c + q\phi_s^* + qV_i^* = \Delta E_{Fn} + \Delta E_c + \Psi_{ms} \tag{6}$$

and $$\Phi_p = -qV_i^* + \Delta E_v + E_{gs} - q\phi_s^* - \Delta E_{Fn} = \Delta E_v + E_{gs} - \Delta E_{Fn} - \Psi_{ms}$$

We also have $$E_{gi} = \Phi_n + \Phi_p, \tag{7}$$

and $V_i^*$ is related to $Q_e^*$ by $$V_i^* = Q_e^*/C_i, \tag{8}$$

where $C_i$ is the capacitance per unit area of the semi-insulator.

THEORY OF OPERATION

The p-channel BICMET operates as a current amplifier by allowing source hole current to flow, which forces a much greater emitter-collector electron current to flow. (The n-channel BICMET operates by allowing source electron current to flow, forcing a much greater emitter-collector hole current to flow.) Thus the BICMET is a bipolar device which manifests current gain and, as such, may be compared to the junction bipolar transistor. However, there are several distinguishing features of the BICMET vis-a-vis the bipolar transistor. Firstly, note that a bipolar transistor has a neutral base; that is, a base region having no potential gradients (i.e., flat energy bands). The BICMET does not have a neutral base; that is, it has electric fields on both sides of the interface. Thus, all of the problems associated with the conduction of emitter-collector current in the base, which includes minority carrier diffusion, carrier scattering, base charge storage effects, high-level injection and the phenomena of punchthrough, do not exist, or are at least substantially reduced, in the BICMET. All these base-related problems present serious limitations to the switching speed of a neutral base device. (The practical requirements of implementing inversion charge at the interface may make it desirable to trade-off some desirable properties to some extent. However, we limit any neutral region in the vicinity of the interface to have a thickness of less than 100 angstroms; it is more typically less than 30 angstroms.) Secondly, the emitter is metallic, and as a consequence the emitter resistance is very low. Thus it can carry much higher current than a semiconductor emitter, and the emitter charge storage is negligible. As used herein, the term "metallic" applied to the emitter refers to a material having a volume resistivity of less then 0.001 ohm-cm at the device operating temperature. It thus includes true metals, which typically have resistivities of less then 100 microhm-cm at 20 degrees C. It can also include metal compounds (e.g., silicides), and degenerately doped semiconductor material; i.e., a doped semiconductor whose Fermi level is in the conduction band (n-type) or in the valence band (p-type).

In the following analysis, the emitter is assumed to be grounded (i.e. only the source and the collector potentials vary), so all voltages are with reference to the emitter potential. Under normal conditions of bias (FIG. 3), the collector and source are positively biased.

Off-State $I_C = 0$

Figure 3:
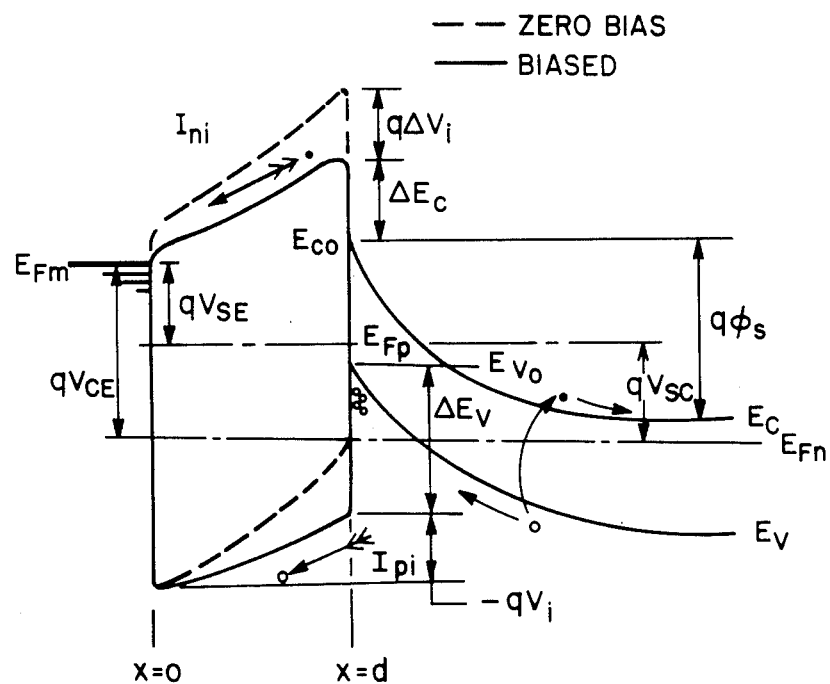
FIG. 3 shows the BICMET in the off state.

FIG. 3 illustrates the device in the off state, that is, with $I_S = 0$. With a positive voltage applied to the collector, the semiconductor goes into partial deep depletion ($\phi_s > \phi_s^*$) because of the leaky nature of the semi-insulator. In other words, in the steady-state condition, the holes generated in the depletion region of the semiconductor are transported through the semi-insulator:

$$J_{pi} = J_g = qx_d n_i/\tau_g, \tag{9}$$

where $J_{pi}$ is the hole current flowing through the semi-insulator, $J_g$ is the current generated in the depletion region, $x_d$ is the semiconductor depletion region width, $n_i$ is the intrinsic carrier density and $\tau_d$ is the semiconductor lifetime.

In order for the semi-insulator to be capable of transporting the generated carriers, it must be appropriately biased. This is achieved by the build-up of inversion charge within the inversion layer, creating a voltage drop $V_i$ given by (see A2)

$$V_i - V_i^* = (Q_s - Q_s^*)/C_i \tag{10}$$

where $V_i$ is the voltage drop across the semi-insulator, $C_i$ is the capacitance of the semi-insulator, and $Q_s - Q_s^*$ is the change in the semiconductor charge under bias, where $Q_s$ is given by (see A3a)

$$Q_s = \left(\frac{2q\epsilon_s}{\beta}\right)^{\frac{1}{2}} \left(p_o + \beta\phi_s\left(N_d - \frac{J_{ni}}{qv_s}\right)\right)^{\frac{1}{2}} \tag{11}$$

and $J_{ni}$ is the semi-insulator electron current as discussed shortly.

When the insulator is biased to $V_i$, the barrier to hole flow from the inversion layer to the emitter is lowered by an amount $\Delta V_i$. Consequently, holes in the inversion layer are injected into the semi-insulator, resulting in a net flow of holes through the semi-insulator to the emitter. The flow of holes give rise to a current density $J_{pi}$ given by (see A18)

$$J_{pi} = qv_p p_o e^{-\beta(-V_i^* + \Delta E_v/q)} (e^{\beta \Delta V_i} - 1). \tag{12}$$

Since $V_i^*$ and hence $Q_s^*$, $\phi_s^*$ and $p_o^*$ are quantities predetermined by the fabrication procedure, then equations (1–5) permit the determination of $p_o$ and $V_i$.

Similarly, biasing the semi-insulator reduces the barrier to electron flow from the emitter to the collector, resulting in a net electron flow of (see A18)

$$J_{ni} = qv_n N_c e^{-\beta \Phi_c q} (e^{\beta \Delta V_i} - 1). \tag{13}$$

On leaving the semi-insulator, the electrons are injected into the collector and join the generated electrons to produce the collector current. Generally speaking, since conceptually the device is designed to produce current gain, $J_{ni} \gg J_{pi}$ so $J_{ni} \gg J_g$. Consequently, the collector current is essentially equal to $J_{ni}$ $$J_c \approx J_{ni}, \tag{14}$$

where we have assumed that the reverse flow is negligible. It also follows from the principle of current continuity that $$J_e = J_{ni} + J_{pi},\quad (15)$$

where $J_e$ is the current density entering the emitter contact.

The BICMET as an Amplifier, $I_c>0$

Figure 4:
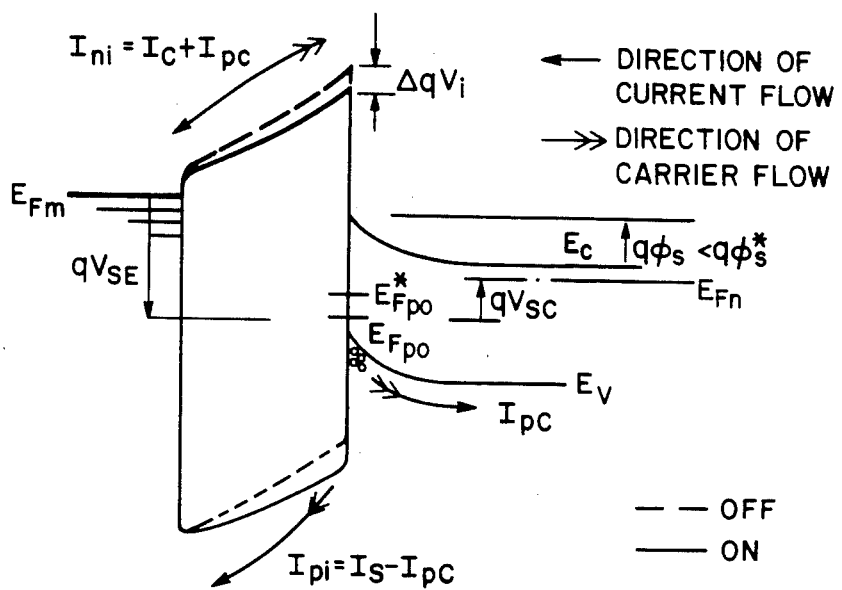
FIGS. 4 and 5 show the internal current flow patterns in the BICMET.
Figure 5:
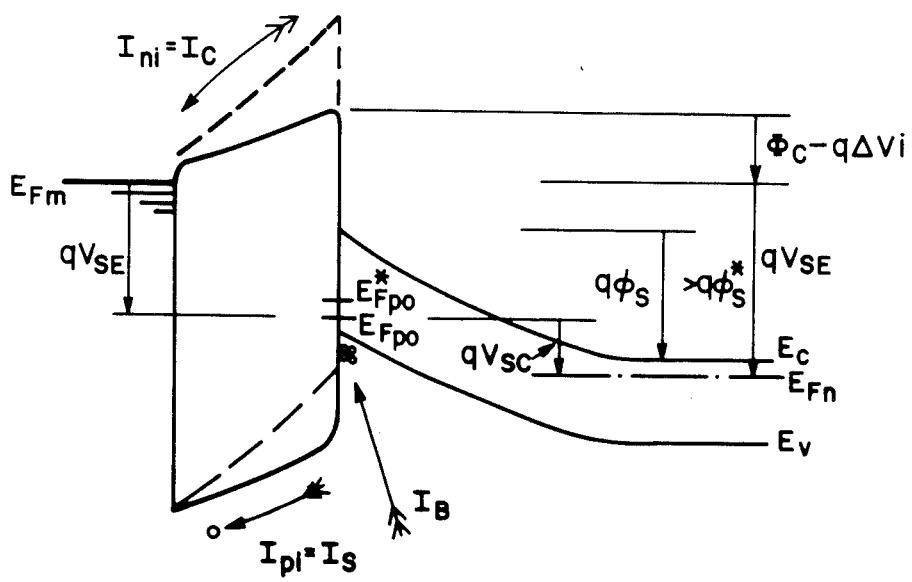

In this section we will consider the characteristics that allow the BICMET to produce current gain. Also, we will consider only the dc characteristics; the dynamic characteristics are considered elsewhere. Generally speaking, the source current that flows into the inversion channel will be considerably larger than the very small current generated in the collector depletion region, so the latter may be ignored from now on. Since $I_C$ is considerably greater than $I_g$, $p_o$ and thus $\Delta V_i$ must increase to provide the necessary biasing condition to support the flow of the source current through the semi-insulator. Biasing the semi-insulator also causes electrons to flow from the emitter through the semi-insulator into the collector, where the high field sweeps the electrons into the neutral section of the collector (FIGS. 4–5). If the semi-insulator is thin enough, the carriers will enter the collector thermionically. Provided the doping is high enough so that the depletion width is thin enough and the depletion field is high enough, the carriers will be "hot" throughout the collector region; i.e. the carriers move with the saturated drift velocity. With a suitable choice of materials and geometries, it can also be designed to operate totally or partially ballistically. This is facilitated by the use of a relatively thin depletion region and thin collector, providing for a high field and reduced carrier collisions with the semiconductor lattice, and hence a high current density. There is no limit on how thin the semi-insulator may be made provided the contact is ohmic, or on the width of the depletion region, other than dictated by capacitance considerations or to avoid tunneling. Another point to note is that the emitter can supply a much greater electron current to the semi-insulator than the inversion channel can supply hole current to the semi-insulator, because of the much lower barrier height at the emitter. Thus, the structure contains the basic requirements for current gain.

I. Voltage Equations

The voltage $V_i$ dropped across the semi-insulator is still obtained through equations (10), (A2) and (A3). The other relevant voltages are as follows. The source-emitter voltage is given by (see equation A4)

$$V_{SE} = \Delta V_i + \beta^{-1} \ln (p_o/p_o^*).\quad (16)$$

It is interesting to note that the insulator voltage is not equal to the source-emitter terminal voltage. This is a consequence of the splitting of the quasi-Fermi levels at the semi-insulator/semiconductor interface (see Appendix A.1). The source-collector voltage is given by (see equation (A5))

$$V_{SC} = \Delta V_i + \beta^{-1} \ln (p_o/p_o^*) - V_{CE} = \beta^{-1} \ln (p_o/p_o^*) - \Delta\phi_s \quad (17)$$

and the surface potential of the collector is given by (see A1)

$$\phi_s = V_{CE} - V_i + \frac{\psi_{ms}}{q}.\quad (18)$$

and $\Delta\phi_s = \phi_s - \phi_s^*$

II. Current Equations ($\Delta V_i \leq \phi_c$)

Figure 6:
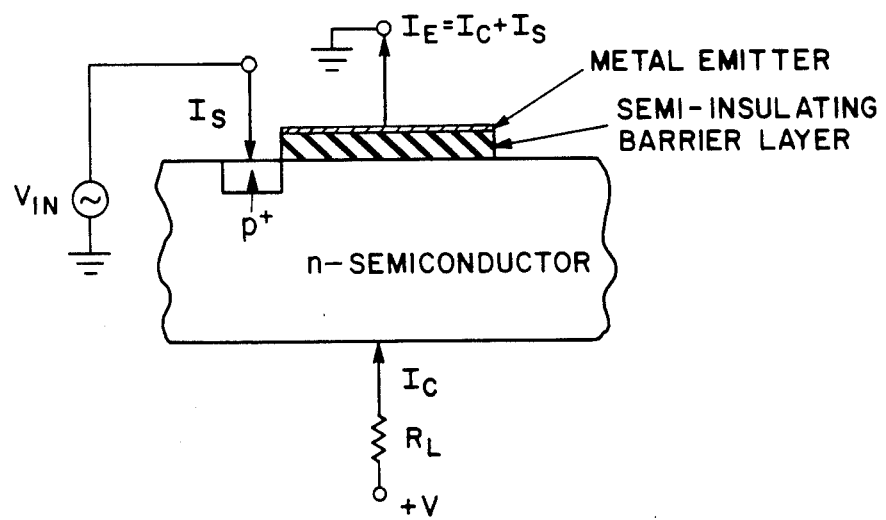
FIG. 6 shows the terminal current flowing in a BICMET circuit.

The terminal currents for the BICMET are shown in FIG. 6 and the various internal currents are shown in FIGS. 4 and 5, from which we have $$I_E = I_{pi} + I_{ni},\quad (19)$$

$$I_S = I_{pi} + I_{pc},\quad (20)$$

$$I_C = I_{ni} - I_{pc}.\quad (21)$$

It is implicitly assumed in (13) that recombination in interface states or in the semi-insulator does not need to be considered. This assumption is justified in the appendices.

Following (12) we have for the hole current in the semi-insulator, assuming $e^{\beta \Delta V_i} \gg 1$ as normally will be the case, $$I_{pi} = qAv_p p_o e^{(q\Delta V_i + qV_i^* - \Delta E_v)/kT},\quad (22)$$

and for the electron current in the semi-insulator from (13), $$I_{ni} = qAv_n N_c e^{(q\Delta V_i - \Phi_c)/kT}.\quad (23)$$

The current component $I_{ps}$ is the portion of the source hole current that flows out of the collector; it has significance only at low $V_{CE}$, when $\phi_s \lesssim \phi_s^*$. To understand the origin of this current, we refer to FIGS. 4, 5, 7, and 8. As $p_o$ builds up to bias the semi-insulator, the Fermi level $E_{Fpo}$ at the semi-insulator/semiconductor interface moves closer to the top of the valence band:

$$p_o = N_v e^{-(E_{Fpo} - E_v)/kT}.\quad (24)$$

At sufficiently low $V_{CE}$ when $E_{Fn} > E_{Fpo}$, the semiconductor surface is forward-biased to the holes. We may, therefore, look at the semiconductor depletion region as an induced one-sided p+-n junction with $p_o$ representing the hole carrier density in the p+ section. Thus, we have for the hole carrier concentration $p(x_d)$ at the edge of the depletion region $$p(x_d) = p_o e^{-\beta \phi_s}.\quad (25)$$

Assming that the neutral section is several diffusion lengths long, and using the long diode equation to calculate the resulting diffusion current, $J_{pc}$, we have $$J_{pc} = \frac{qD_p}{L_p}(p(x_d) - p_{no}) = \frac{qD_p}{L_p}(p_o e^{-\beta\phi_s} - p_{no}),\quad (26)$$

where $p_{no}(=n_i^2/N_d)$ is the equilibrium hole density in the neutral n-section. As $V_{CE}$ and hence $\phi_s$ increase, eventually $E_{Fpo} > E_{Fn}$. In effect, the induced p+-n junction is now reversed-biased, so $I_{pc}$ ceases to flow, and all the source current is now forced to flow through the semi-insulator. The reverse-biased induced junction will now be a source of generated holes which will flow towards the semiconductor surface; however, as previously noted, this current is negligible compared with the source current and will not be considered further.

III. Current Gain

Small-signal current gain is defined as $dI_C/dI_S$ with $I_{pc}=0$. Thus, from (20-23) we find, assuming $v_p=V_n$, $$G = \frac{dI_C}{dI_S} = \frac{N_c}{p_o} e^{(\Delta E_v - \Phi_n)/kT} \quad (27)$$

Normally, we would require $\Phi_n \simeq 0$, so with a suitable choice of $\Delta E_v$ the gain can be very large. For example, for $\Delta E_v = 0.3$ V and $p_o \simeq N_c$, which is typical as we discuss in the next section on silicon technology, current gains of over $10^4$, and typically on the order $10^5$, are attainable. Generally speaking, current gain will decrease with incresing source current and, hence, increasing collector current. The reason for this is that a larger $p_o$ and $\Delta V_i$ are required in order to support a larger source current—see (22)—and, from (27), G is inversely proportional to $p_o$. It is also noted that the gain increases rapidly with decreasing temperature; however, the emitter and hence collector currents for a given $\Delta V_i$ decrease rapidly with temperature. These tend to be cancelling effects, although $I_C$ does increase for a constant $I_S$ as the temperature is reduced.

DEVICE STRUCTURES

III-V Material Technologies

The use of high mobility materials has long been proposed as a superior alternative to Si for high-speed ICs. However, the advantages have been difficult to realize because of the problems in fabricating viable bipolar or MOSFET devices. The only device available for GaAs integrated circuits, for example, is the MESFET (Metal Semiconductor Field-Effect Transistor) which suffers from the problems of threshold control and logic swing for enhancement-mode technologies. Additional problems are excessive power dissipation and requirements of level shifting for depletion-mode technologies. The BICMET offers a means of implementing a high-performance device structure in nonsilicon materials. The structure appears particularly attractive for those material combinations which have already been demonstrated using Molecular Beam Epitaxy (MBE) techniques; see for example, U.S. Pat. No. 3,615,931, "Technique For Growth of Epitaxial Compound Semiconductor Films", coassigned with the present invention.

Figure 9:
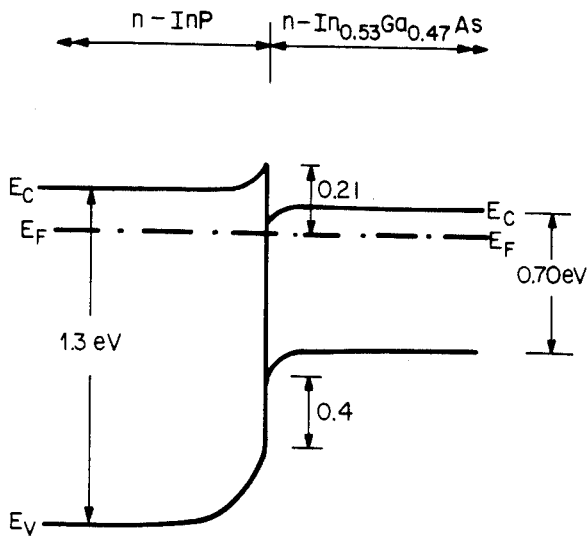
FIGS. 9 and 10 show a heterojunction, and BICMET, formed with InGaAs.
Figure 10:
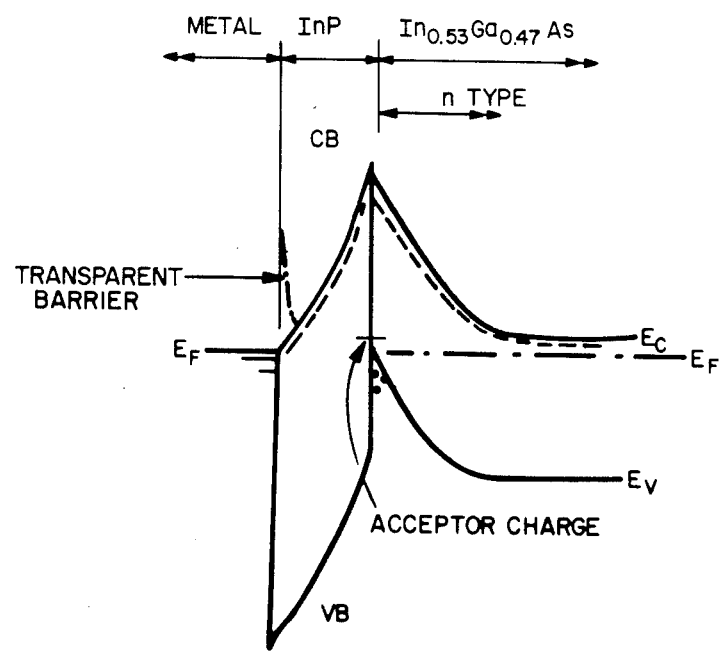

The control and uniformity obtained in simple heterostructures are more than adequate for fabricating the BICMET structure. For example, n-InP/n-In$_{0.53}$Ga$_{0.47}$As heterostructures have been fabricated having good electrical characteristics. A typical energy diagram for this combination is shown in FIG. 9 where the InP is restricted in thickness to about 300 Å. We also note that the band-gap discontinuities of $\Delta E_c = 0.21$ eV and $\Delta E_v = 0.4$ eV are particularly attractive to form a p-channel BICMET with very high current gain. Now this structure does not have the desired energy band configuration shown in FIG. 2 because the narrower-bandgap semiconductor is accumulated rather than inverted. However, consider the structure shown in FIG. 10. Here the wide-band-gap layer of InP is doped very close to the surface using MBE techniques with acceptor ions over a distance of about 10–30 angstrom with a concentration of $N_A = 10^{19}$ cm$^{-3}$. The concentration of this charge must be sufficiently large to cause inversion of the interface. (It is possible to achieve the same result by doping the narrow-band-gap semiconductor in a similar fashion. However, since it is desired to avoid the formation of a neutral base layer, it is desirable to locate the acceptor on the wide-band-gap side of the interface.) The InP layer is to be doped n-type to approximately $N_d = 10^{19}$–$10^{18}$ cm$^{-3}$ with a suitable dopant and the thickness is chosen to be less than the equilibrium depletion width corresponding to the doping of the InP so that the entire layer is depleted. For doping concentrations in the range $10^{18}$ cm$^{-3}$, the InP thickness would therefore be about 200–300 angstroms. It will be noted that the doping level in the InP is considered sufficiently high and hence the energy barrier represented by the dotted line sufficiently thin that it is totally transparent to electrons, as one always finds at an N+Si/metal contact. It migh appear at first glance that the transparent barrier at the emitter interface constitutes a specific contact resistance in the same fashion that a metal does in contacting a junction. However, in this case there is no neutral section in the contact region, so that part of the source emitter voltage ($V_{CE}$) is actually dropped across the transparent barrier. Therefore, the interfacial resistance will be lower than that encountered in a conventional ohmic contact of the same doping.

Figure 11:
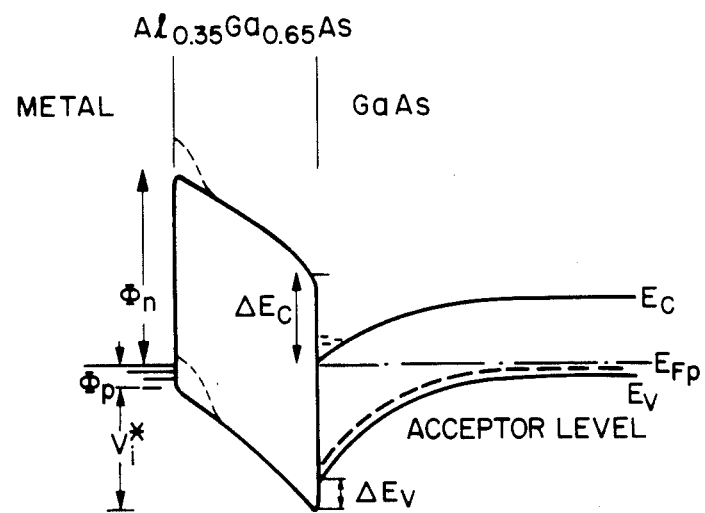
FIG. 11 shows a n-channel AlGaAs-GaAs BICMET energy diagram.
Figure 12:
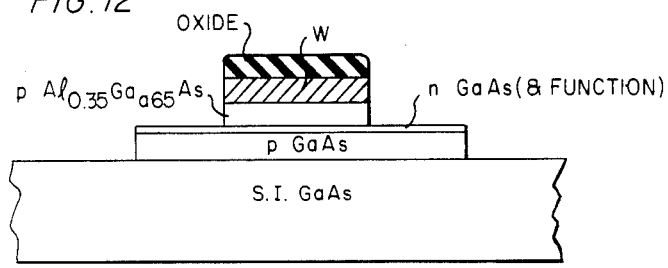
FIGS. 12–15 show process sequences for an AlGaAs-GaAs BICMET.

The AlGaAs-GaAs system is a very attractive candidate because of the technology base that has already been established in the development of the DH (double heterojunction) laser. For this case the relevant energy parameters are $\Delta E_g = 0.4$ eV, $\Delta E_c = 0.32$ and $\Delta E_v = 0.08$. To realized maximum gain, the channel carrier is chosen that provides the maximum barrier to semi-insulator conduction. Therefore, an n-channel BICMET is chosen, with electron conduction in the inversion channel. The energy diagram for this transistor is shown in FIG. 11. In principle, for the n-channel BICMET, $\Delta E_v$ is ideally zero. The converse is true for the p-channel BICMET; i.e., $\Delta E_c = 0$. In both cases, it is desirable that $\Delta E_g$ is maximized.

Figure 13:
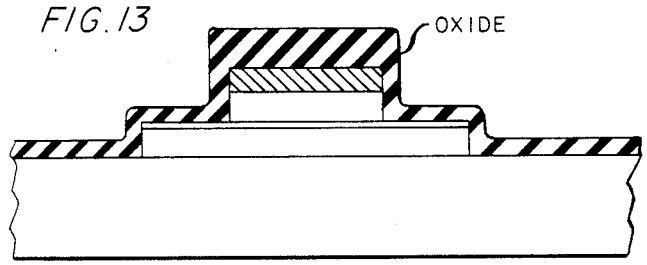
Figure 14:
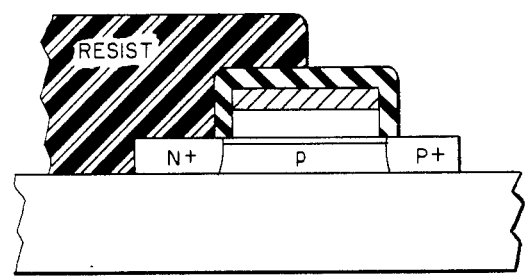
Figure 15:
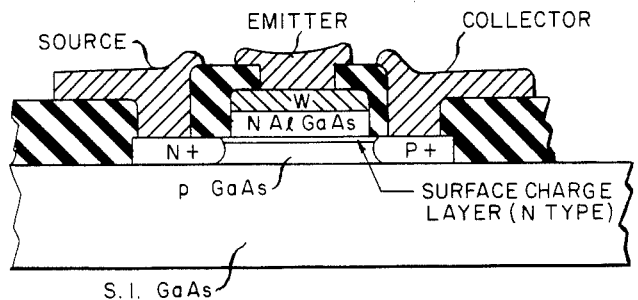

In FIGS. 12–15 we show a cross-section of the transistor, indicating how it can be fabricated in an integrated circuit technology. The starting material is semi-insulating gallium arsenide upon which successive layes are grown using molecular beam epitaxy. The layers in sequence are: (i) GaAs (p-type, $10^{17}$–$10^{18}$ cm$^{-3}$, 1–2 $\mu$m); (ii) GaAs (n-type $10^{19}$ cm$^{-3}$, 10–30 angstroms); (iii) AlGaAs (p-type $10^{18}$ cm$^{-3}$, 300–400 angstroms). The concentration at the top surface of the AlGaAs is increased as high as possible to assist in making the best possible ohmic contact. A refractory metal such as tungsten and an overlayer of CVD (Chemical Vapor Deposition) oxide are deposited and patterned and then the oxide is used as an etch mask to remove the AlGaAs material as shown in FIG. 13. Then more CVD oxide is deposited and reactive ion etched to protect the AlGaAs sidewall. Using either one or two resist masking steps, implantation is used to create an N+ self-aligned source contact and a p+ collector contact. (The p+ contact does not need to be self-aligned). The device can now be annealed at 800–830 degree C. without danger of interaction between the tungsten and AlGaAs or of significant impurity ion motion. Finally, the contacts are metallized with the use of an additional layer of dielectric isolation. Alternately, the dielectric isolation could be put down earlier in the sequence to allow emitter metal to cross the mesa edges.

Another ternary combination which is attractive for the BICMET and which is presently receiving much attention because of its application to the 1.3 $\mu$m fiber optic need is InAlAs-InGaAs. In this case $\Delta E_c = 0.3$ eV and $\Delta E_v = 0.2$ eV so the n-channel BICMET is still the preferred choice. Other possibilities are the combinations AlAs-GaAs and $Al_{0.5}In_{0.5}P$-$Ga_{0.6}In_{0.4}As$, both of which are known to have a reasonable match in lattice constants (hence controllable interface state densities) and attractive $\Delta E_c$ and $\Delta E_v$ values. Another possibility is the choice $In_{0.71}Ga_{0.29}As_{0.63}P_{0.37}$/InP with the discontinuities $\Delta E_c = 0.22$ eV and $\Delta E_v = 0.18$ eV. Clearly, the possible combinations of materials are wide, and the choice will be presumably dictated by the application, ease of fabrication, etc.

Furthermore, we estimate that lattice mismatch will have a relatively small effect on device operation, because the zero-bias inversion condition inhibits recombination through any states that do exist. As a result, many material combinations (for the semi-insulator and semiconductor) that are poorly matched may also be considered. Not only are a wider range of group III-V combinations possible, but also groups II-VI combinations. The atomic spacing of different semiconductor materials typically must be within 3 percent of each other for heterojunction transistors. In contrast, the BICMET can operate satisfactorily with greater mismatches. We estimate that it can operate satisfactorily even for materials differing greater than 5 percent in atomic spacing. This also implies that either the semi-insulating region, or the semi-conducting region (or both) can be polycrystalline or amorphous. (Note in fact that SIPOS is typically amorphous.) Hence, the low rate of recombination at the inverted interface allows device structures (e.g., vertical stacking) and materials not previously viable in some cases.

Silicon Technology

Figure 16:
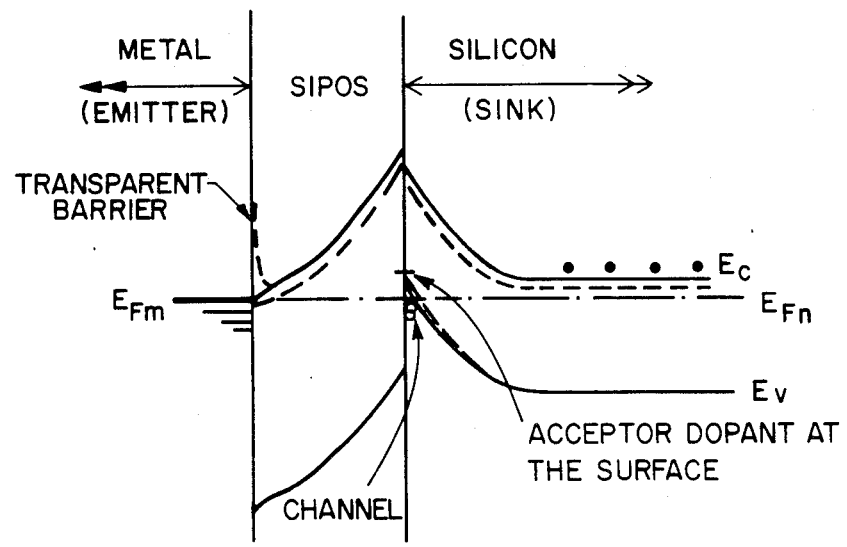
FIG. 16 shows a p-channel SIPOS-Si BICMET energy diagram.
Figure 17:
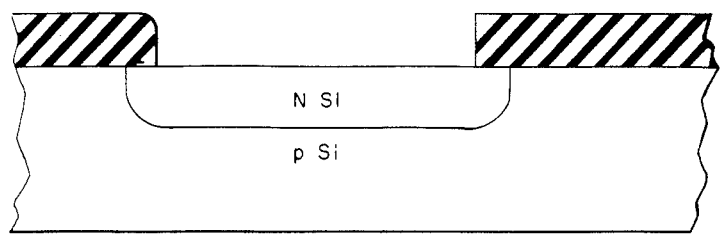
FIGS. 17–20 show process sequences for a p-channel SIPOS-Si BICMET.
Figure 18:
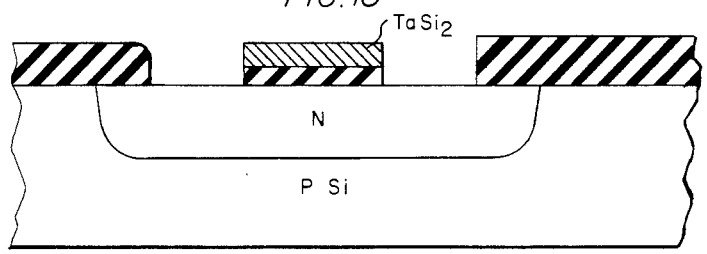
Figure 19:
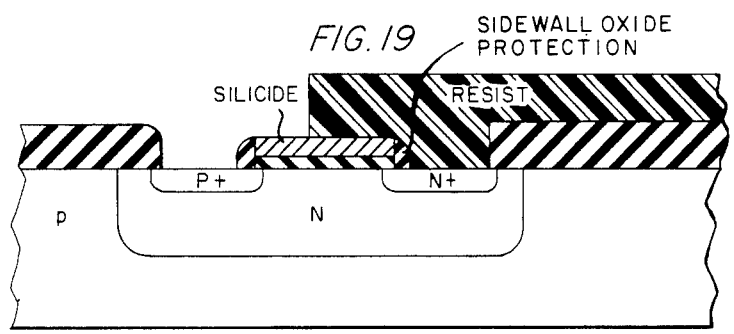
Figure 20:
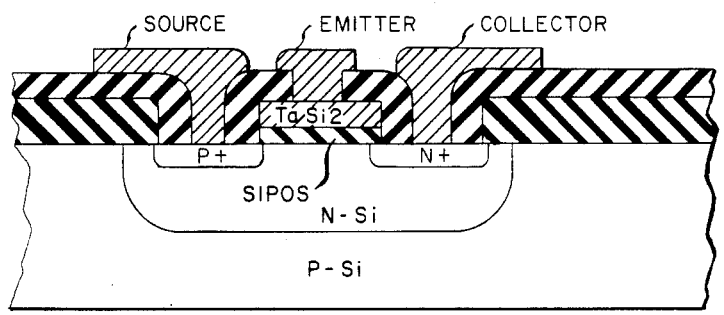

The BICMET structure in silicon technology can be implemented by using a deposited SIPOS film on a silicon substrate. For SIPOS deposition techniques, see for example, "Semi-Insulating Polysilicon (SIPOS) Deposition in a Low Pressure CVD Reactor, I, Growth Kinetics", M. L. Hitchman et al, Journal of Crystal Growth, Vol. 55, No. 3, pp. 485-500 (also see pp. 501-509) (1981). It has been shown with suitable fabrication procedures that SIPOS may be produced with a band gap of about 1.5 eV, and resistivities in the range $10^8$-$10^{10}$ ohm-cm. However, SIPOS doped with phosphorous or boron, followed by high-temperature annealing, has resistivities in the range $10^{-1}$ to $10^6$ ohm-cm. The high-temperature annealing apparently activates the dopants, causing the Fermi level to move from midgap to the appropriate band edge. SIPOS has, in fact, been used to produce high-gain heterojunction transistors. Phosphorous-doped SIPOS appears to produce a barrier, $\Delta E_c = E_{Ci} - E_C$ at the SIPOS-Si interface of about 0.1-0.2 eV and a barrier $\Delta E_v = E_{hd}v - E_{vi}$ of about 0.3-0.4 eV. The energy diagram for this BICMET configuration is shown in FIG. 16. Again a surface layer of acceptor ions is required at the interface between the SIPOS and the Si to create an inversion layer. In this case, it would not typically be feasible to place the p+ interfacial adjustment charge layer in the SIPOS by MBE. Thus, in this case it would be desirable to deposit the layer at the silicon surface by MBE. This layer should be sufficiently thin (10-30 Å) to avoid the possibility for a (neutral) base layer to exist. As noted above, if the length of the channel is made small enough, two-dimensional charge-shifting effects can automatically cause inversion of the interface. This "short-channel" phenomenon is well known as a detrimental effect in sub-micron MOS devices. In order to induce this effect, the channel length is typically less than about three times the depth of the depletion region of the channel p+ well. If the source junction were located on both sides of the emitter, then the maximum channel length is about six depletion depths.

Proper construction and doping of the SIPOS film is of significance for obtaining optimum device performance. It is proposed to use MBE (molecular beam epitaxy) or extremely low energy implants followed by rapid thermal annealing to achieve the highly localized charge layers. A silicide (Ta, W, or Ti) is a good choice of metal for the emitter because (a) it allows the implantation of a self-aligned channel-emitter junction to feed the inversion channel (b) it tolerates the subsequent high temperature annealing required to activate the implant. It is likely that RTA (rapid thermal annealing) can be advantageously used to produce the highly localized charge profiles. A typical process sequence is shown at the important steps in FIGS. 17-20. Sidewall oxide protection during the implantation step as shown prevents the doping of the SIPOS sidewalls.

DEVICE CHARACTERISTICS

Based on reasonable parameters, the various device characteristics have been generated for the structures described above.

SIPOS-Si Systems

In order to discuss the device characteristics and to relate them to the physics in a simple and straightforward manner, we will initially ignore space charge effects in the collector due to high collector current densities. These space-charge effects result in partial neutralization of the donor density in the semiconductor (i.e., creates a neutral region) which causes an increase (stretching) in the semiconductor depletion region width. This effect we designate "collector stretching". At the end of this section we will include this effect in a practical design to assess the limitations it imposes. Physically speaking, the injection of mobile electronic charge into the collector depletion region causes a debiasing of the barrier layer (i.e., less net positive charge available to bias the barrier layer) and hence a reduction of the emitter-collector current flow. Furthermore, the space-charge modulation of the collector current, coupled with the transit time delay of the carriers through the collector depletion region, opens the possibility of a tunable low-noise solid-state oscillator capable of frequencies in the infra-red region (approaching the $f_t$ of the transistor—1600 GHz); i.e., a coherent source.

Figure 21:
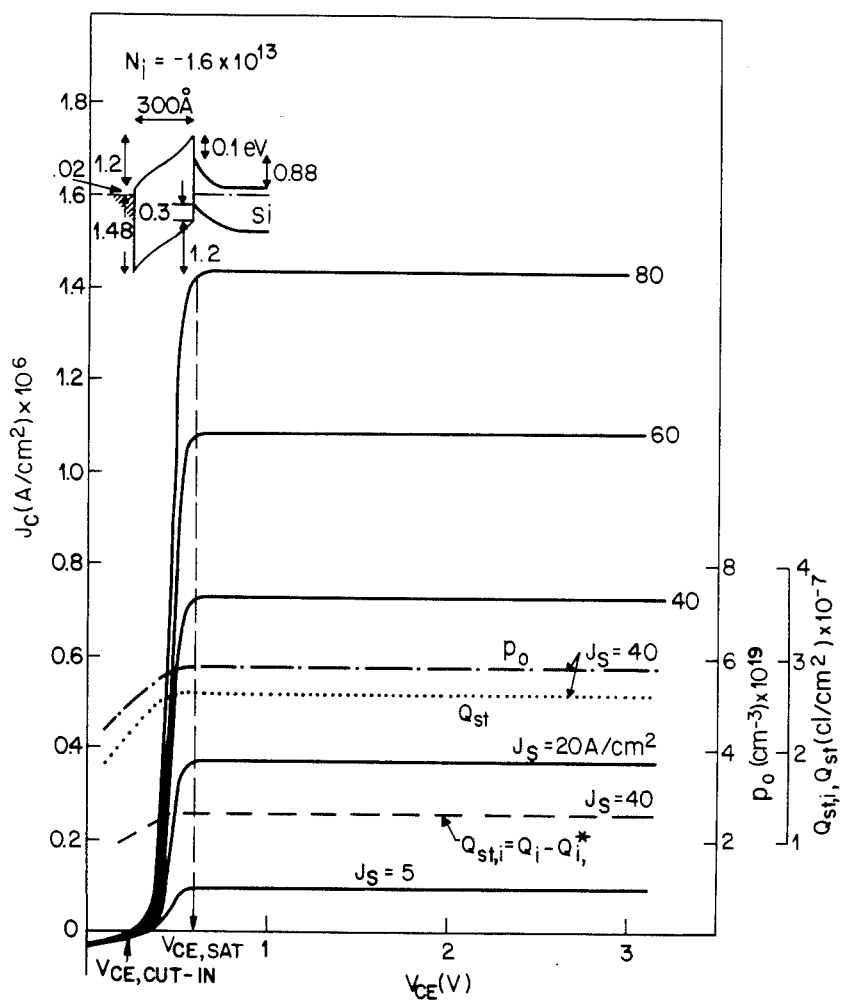
FIGS. 21–25 show device characteristics for p-channel SIPOS-Si BICMETS.
Figure 22:
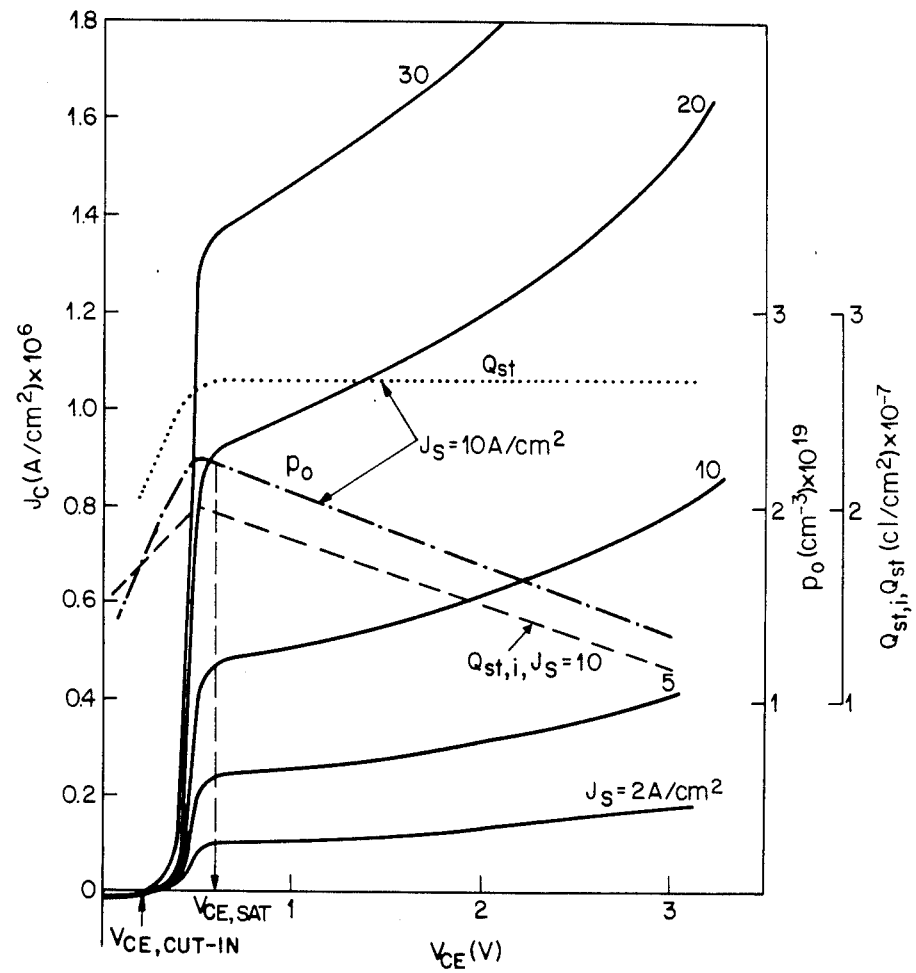
Figure 23:
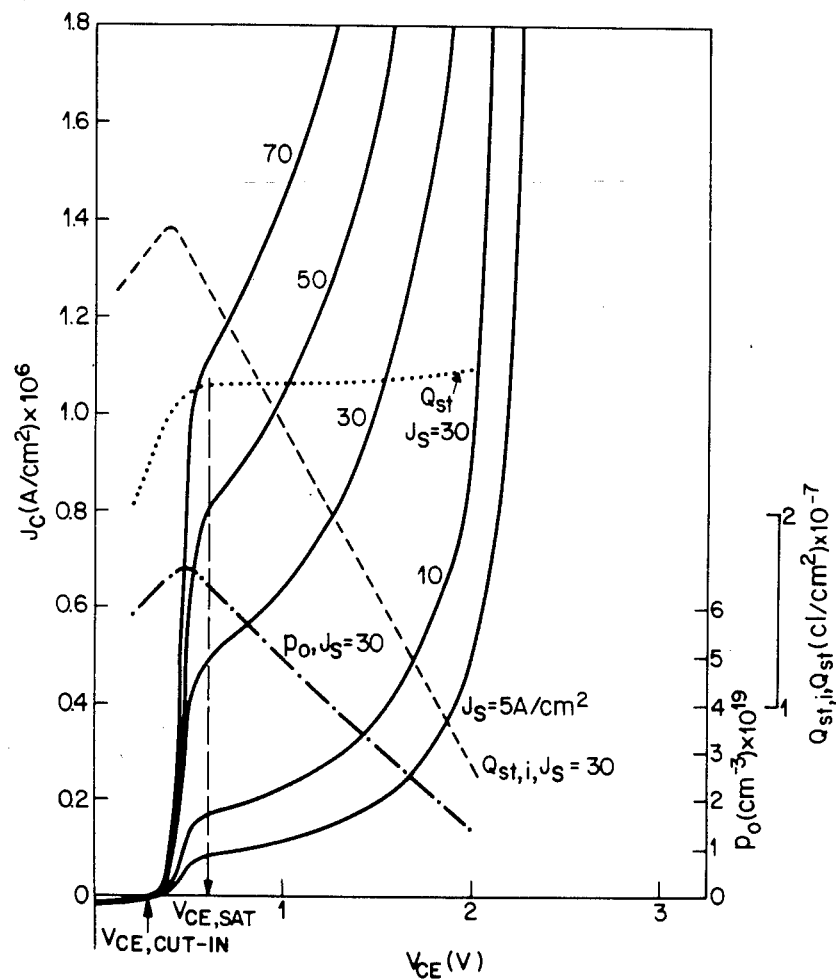

FIGS. 21-23 illustrate the common-emitter output characteristics of the SIPOS-Si BICMET shown in the inset of FIG. 21. All three curves have identical material parameters except for the silicon doping concentration which varies as $N_d = 10^{15}$, $10^{17}$ and $10^{18}$ cm$^{-3}$ for FIGS. 21-23 respectively. In the calculations, the relative dielectric constant for SIPOS was taken as 8, $v_{tn} = v_{tp} = 10^7$ cm/sec and the thermionic conduction limit was assumed. The BICMET common-emitter output characteristics of FIGS. 21-23, are similar in structure to bipolar common-emitter output characteristics, with two obvious differences. The first of these is the very high gain of the BICMET, typically $2 \times 10^4$, which is of the order of 200 times greater than for bipolar transistors. The second is the high collector current, typically of the order $10^6$ A/cm$^2$, yielding a maximum transconductance of approximately $4 \times 10^7$ A/(cm$^2$−V), which is almost an order of magnitude greater than that of the bipolar transistor. On the debit side the $V_{CE,cut-in}$ is somewhat higher at (0.2 V) than found in bipolar transistors, but this is not considered to be of any serious consequence. For the non-silicon materials the use of MBE allows us to grade the bandgap of the collector from narrow band gap at the interface to wide band gap at the depletion edge. This technique can reduce the $V_{CE}$, cut-in to almost zero as shown below.

The collector current is observed to be negative at low $V_{CE}$ ($<V_{CE,cut-in}$). This is a consequence of the fact that the depletion region of the semiconductor is forward-biased, thus providing a low-impedance path for the holes from the channel to the collector. To support this flow of holes, $p_o$ needs only to be small, because of the relatively low semiconductor barrier height $\phi_s$ (see (19)). Because $p_o$ and hence $Q_s$ are small, $\Delta V_i$ is very small so $I_{ni}$ is much less than $I_{pc}$, resulting in negative collector current (see (21)). As $V_{CE}$ and, hence, $\phi_s$ increases, $p_o$ and, thus, $Q_i$, must increase to maintain constant base current. However, increasing $p_o$ results in an increase in $\Delta V_i$ and, consequently, in $I_{pi}$ and $I_{ni}$. Cut-in occurs when $I_{ni}=I_{ps}$; that is, when $I_c=0$ (see (14)). For typical parameter values for the SIPOS-Si system, $V_{CE}$ for this condition yields $V_{CE,cut-in} \approx 0.2$–$0.3$ V. While a smooth transition to the wider bandgap material (i.e., grading) can thus reduce $V_{CE}$, cut-in, it is also possible to achieve this result by an abrupt transition. That is, an additional layer of material (not shown) can be added to the bottom of the collector region shown in FIG. 1. This additional layer can have a bandgap larger than that of the collector material in the vicinity of the interface. The narrower bandgap collector material can then have a thickness of perhaps one, or a few, depletion widths.

Further increase in $V_{CE}$, and thus $\phi_s$, causes $p_o$ and hence $\Delta V_i$ and $I_{ni}$, ($\simeq I_C$) to increase further still. Eventually $I_{ni}$, and hence $I_c$, saturate when essentially all the channel current flows through the semi-insulator, i.e., $I_{pi} \simeq I_s$. At this point, $p_o$ and $\Delta V_i$, and hence $I_{ni}$, become constant, so the collector current becomes constant. Further increase in $V_{CE}$ simply causes $\phi_s$ to increase (since $\Delta V_i$ is essentially constant—see (21). Provided that the change in the charge in the depletion region due to increasing $\phi_s$ is small compared to $p_o$, then the semiconductor charge $Q_s=Q_i+Q_d$, and thus $V_i$, will remain essentially constant, since (see Appendix A1) $V_i=-Q_s/C_i$. With $V_i$ constant $I_{ni}$, and hence $I_c$, remain essentially constant. This happens to be the situation for the output characteristics of the BICMET shown in FIG. 21, which has a semiconductor doping concentration of $10^{15}$ cm$^{-3}$, as is apparent by the very flat saturated section of the curves. The dotted curve in FIG. 21 illustrates the stored charge $Q_{st}=Q_s-Q_s^*$ for $J_s=40$ A/cm$^2$. As predicted, it is seen that $Q_s-Q_s^*$ increases with $V_{CE}$ and finally saturates at a value of $2.7 \times 10^{-7}$ C/cm$^2$ when the output curves saturate; i.e., when $V_{CE}=V_{CE,sat}$. The inverse of the slope of this saturated portion is the common emitter output resistance $R_{oe}$ which is derived elsewhere $$\text{ref}[6] \quad R_{oe} = \frac{p_o}{\beta I_s N_d}.$$

Thus, for a device delivering 10 mA and using the typical value of $$p_o = 10^{19} \text{ cm}^{-3} \quad R_{oe} = \frac{10^{19}}{40 \times 10^{-2} \times 10^{15}} = 2 \times 10^4 \text{ ohms,}$$

which is typical of a bipolar transistor delivering the same current.

In contrast to the flat saturated section of the output characteristic of FIG. 21 it is seen that the saturated sections of the output characteristics in FIGS. 22 and 23 increase markedly with increasing $V_{CE}$. The reason for this is the high semiconductor doping ($10^{17}$ and $10^{18}$ cm$^{-3}$) of the BICMET which causes the charge $Q_d$ in the depletion region to make a substantial contribution to the semiconductor charge $Q_s$. Thus, as $\phi_s$ increases beyond its value at saturation, $Q_s$ increases due to the increase in $Q_d$; $Q_s=Q_i+Q_d$, which causes $V_i$ to increase beyond its saturation value. Consequently, $I_{ni}$ and, hence, $I_c$ increase with increasing $V_{CE}$, the effect being more pronounced the greater $N_d$, as is apparent from a comparison of FIGS. 22 and 23. The saturation section of the characteristics of FIG. 23 at the higher values of $V_{CE}$ shows the current rising extremely rapidly with increasing voltage, reminiscent of punchthrough. However, this portion of the characteristic is actually true device behavior; that is, control of the characteristic is still exercised by the base current, whereas control would be lost if it were punchthrough.

Beyond saturation, $$I_{pi}=I_C=qv_p p_o e^{(q\Delta V_i + q V_i^* - \Delta E_v)/kT},$$

and since $V_i$ increases with $V_{CE}$ beyond saturation, it follows from (22) that $p_o$ and hence $Q_i$ must actually decrease with increasing $V_{CE}$. Thus, for the characteristics shown in FIGS. 22 and 23, $Q_i$ must actually exhibit a maximum with $V_{CE}$ at $V_{CE,sat}$. This is indeed the case as shown by the dashed line in FIGS. 22 and 23, which corresponds to the $Q_{st,i}(=Q_i-Q_i^*)$ vs. $V_{CE}$ characteristic for $J_s=10$ A/cm$^2$ and 30 A/cm$^2$, respectively. Furthermore, although the output characteristic rises rapidly for $V_{CE}>V_{CE,sat}$, $\Delta V_i$ in fact changes only slightly due to the exponential dependence of $I_{ni}$ and, hence, $I_c$ on $V_i$. Since $\Delta V_i$ varies only very slowly with $V_{CE}$ beyond saturation, then it follows that $\phi_s$ must increase almost linearly with $V_{CE}$ in this voltage range.

The CE output characteristics for the device shown in FIG. 22 ($N_d=10^{17}$ cm$^{-1}$) show that the current gain is seen to increase with decreasing temperature in accordance with (20): at 200 degrees C. the current gain increases to $2 \times 10^6$ from $4 \times 10^4$ at 300 degrees C., and decreases to $1.4 \times 10^4$ at 400 degrees C.

We have also investigated the effect on the CE output characteristics of changing the SIPOS thickness from 300 Angstrom, to 150 Å. The two distinctive features vis-a-vis the equivalent 300 Å device are: the gain is reduced to about $10^4$, but the output impedance increases. Both of these effects are a consequence of a thinner SIPOS layer being biased less for a given charge, resulting in a lower $I_{ni}$ and, hence, a lower $I_c$.

Figure 24:
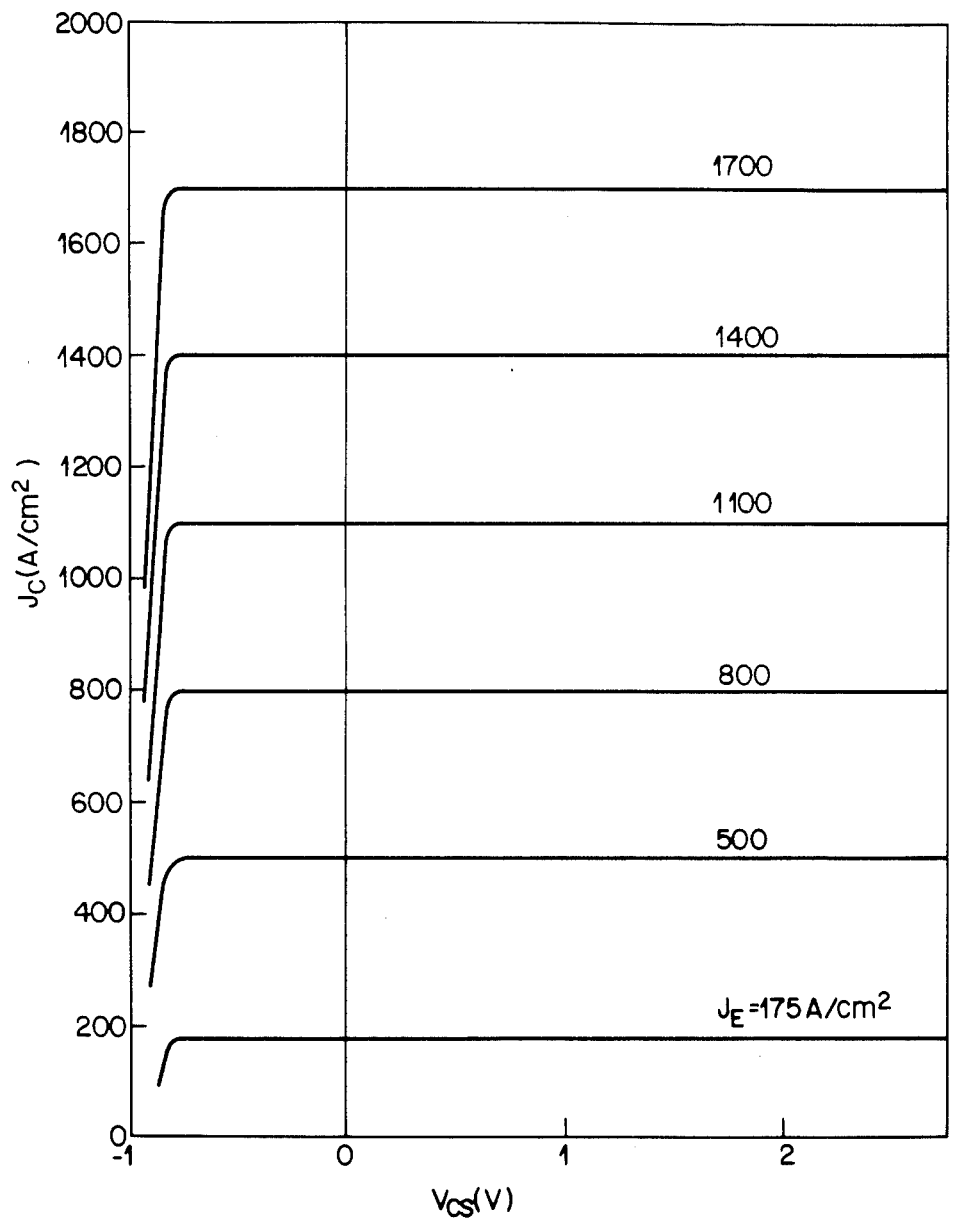

FIG. 24 illustrates the common-source output characteristic for the BICMET, with a semiconductor doping of $10^{17}$ cm$^{-3}$. In contrast to its common-emitter output characteristic, the saturated portion of the characteristic is very flat, indicating a very high differential output impedance. In fact, the common-source output resistance is given by $$R_{oc} = \frac{p_o G}{\beta I_s N_d} = GR_{oe}.$$

So, for the device described previously (i.e., delivering 10 mA) and using $G=10^5$, then $R_{oc}=R_{oe}\times G=2\times 10^4\times 10^5=2\times 10^9 \Omega$. This is about $10^3$ times as high as a typical $R_{ob}$ for bipolar transistors, so in this mode of operation the BICMET is an excellent constant current generator.

Figure 25:
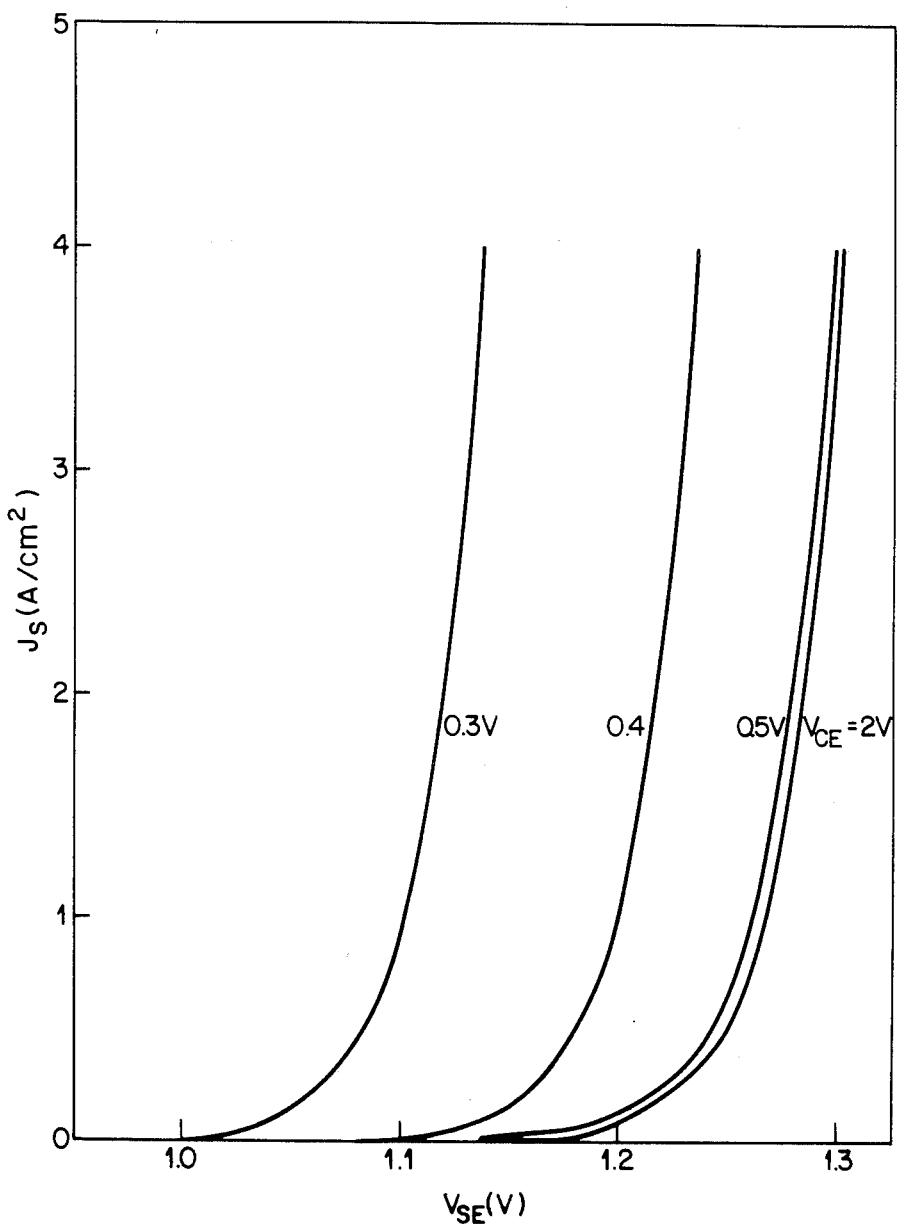

The common-emitter input characteristic, $V_{SE}$ vs. $J_s$ with $V_{CE}$ as parametric variable for the device of FIG. 22, is shown in FIG. 25.

III-V Compounds

Figure 26:
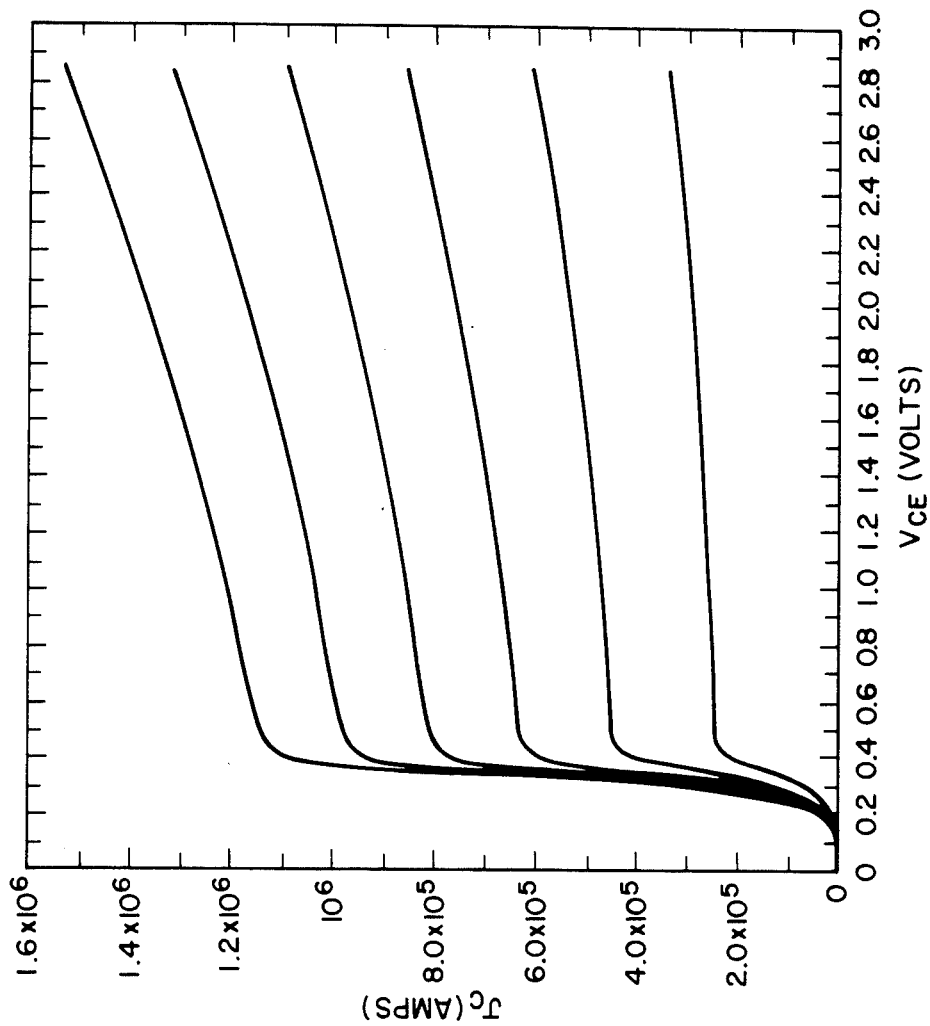
FIG. 26 shows device characteristics for a n-channel AlGaAs-GaAs BICMET.
Figure 27:
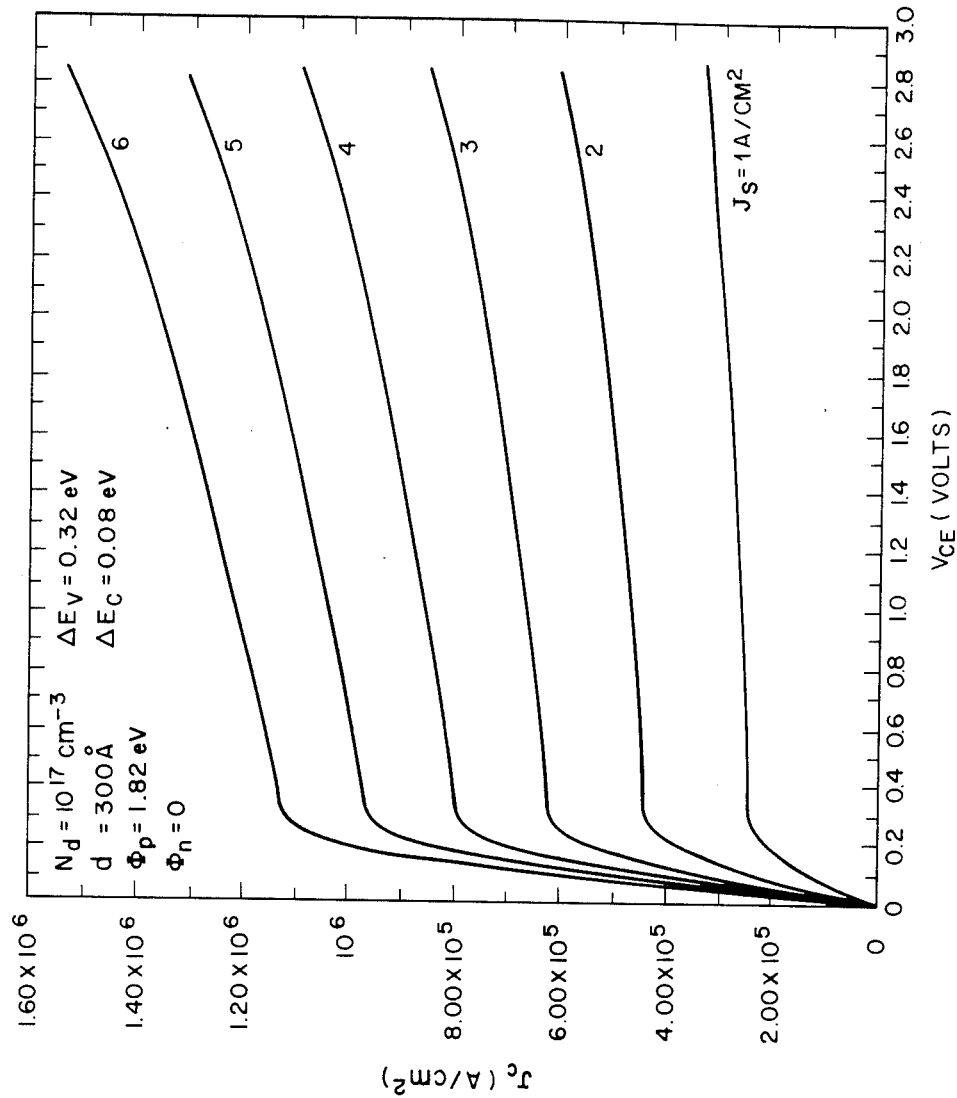
FIG. 27 shows device characteristics for an AlGaAs-GaAs BICMET, with a graded collector energy gap.

FIGS. 26 and 27 illustrate the common-emitter output characteristics for the $Al_{.35}Ga_{0.65}As/GaAs$, InP-/$In_{0.53}Ga_{0.47}As$ systems with the $Al_{0.35}Ga_{0.65}As$ and InP layers 300 angstroms thick and the doping of the other layers at $N_d=10^{17}$ cm$^{-3}$. Although the corresponding bandgaps of the three systems differ substantially, the characteristics are remarkably similar, the main difference being that the current levels and the current gain differ somewhat, typical current gains for the three systems being $3\times 10^5$ and $1.7\times 10^5$ respectively. In FIG. 27 we show the effect of grading the energy gap of the collector region. The energy gap of the collector is graded from the narrowband value at the interface to the wide-band value at the edge of the collector depletion region. The curves are identical to FIG. 26 but the cut-in voltage has been eliminated.

The Effects of Collector Stretching

Figure 28:
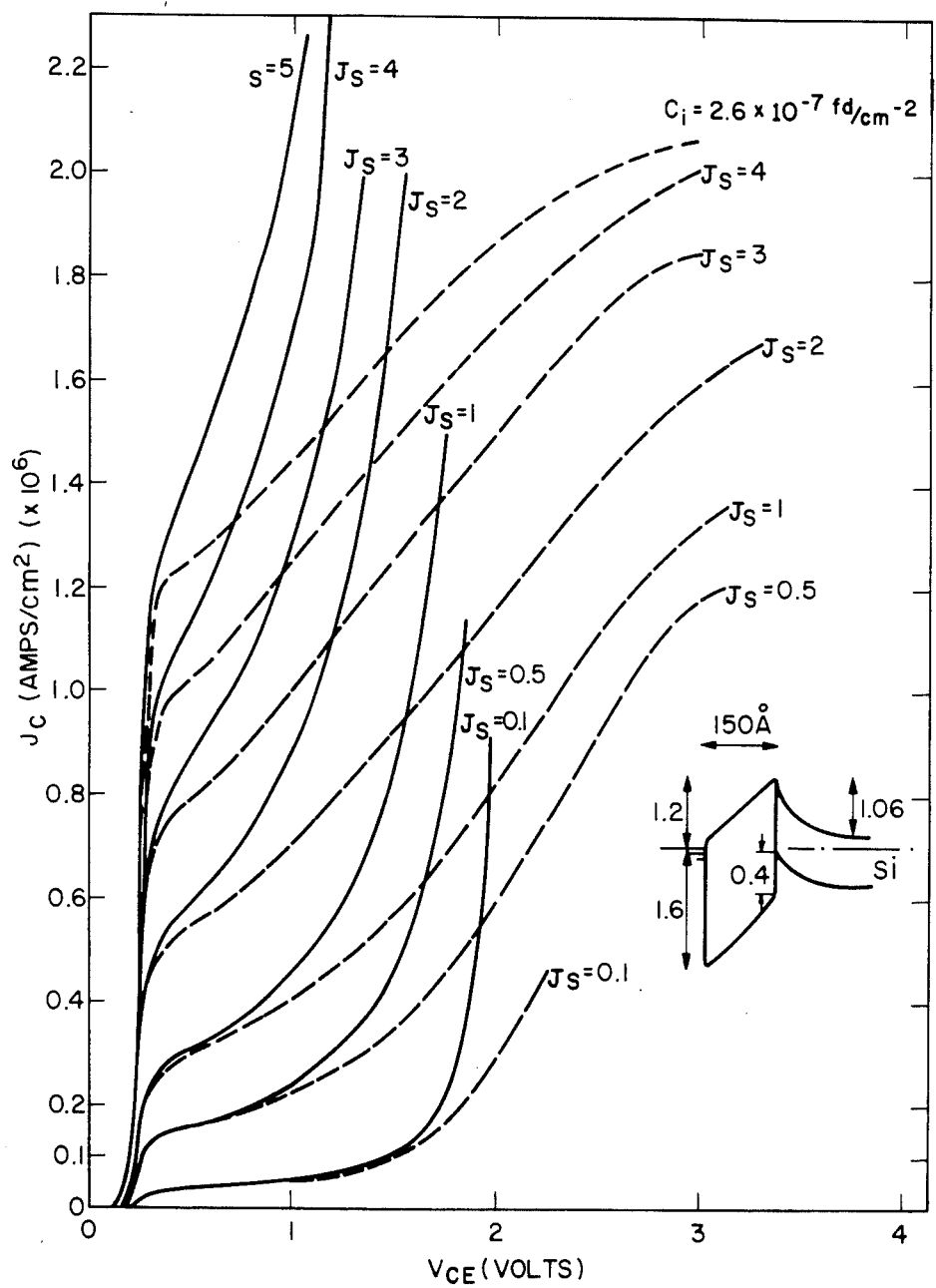
FIG. 28 shows the effect of collector stretching on a p-channel Si BICMET.
Figure 29:
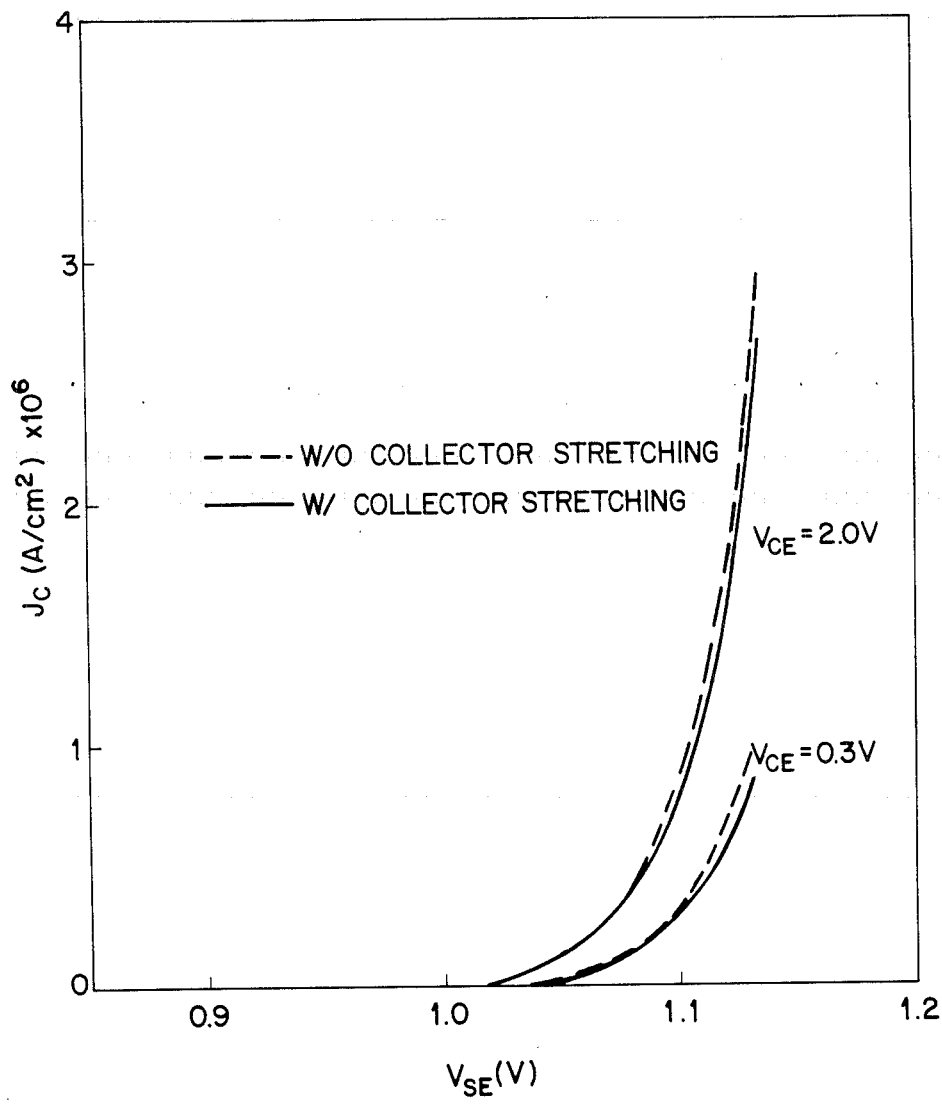
FIGS. 29–30 show device characteristics for the p-channel Si BICMET with and without collector stretching.

The effect of collector stretching was examined using a device which had been scaled in the vertical dimension. The device parameters are now $\Delta E_v=0.4$ eV, $N_d=2\times 10^{18}$ cm$^{-3}$ and d=150 angstroms (see FIG. 21) as shown by the inset in FIG. 28. FIG. 28 illustrates the common-emitter output characteristics for this device and it shows that the gain is now $5\times 10^5$, which incidentally is an increase by a factor of 10 from the device with $\Delta E_v=0.3$ eV (see FIGS. 21-23). The change in device parameters has decreased the cut-in voltage and saturation voltage by about one half to $\approx 0.12$ V and $\approx 0.38$ V respectively. The characteristics are shown with and without collector stretching. The stretching becomes pronounced as $J_c$ approaches $10^6$ A/cm$^2$. The effect of stretching is always to reduce the current since the collector depletion charge becomes less effective in biasing the barrier. The stretching therefore allows greater control over the output characteristic, i.e., it allows the application of larger $V_{CE}$ and gives a larger $R_{oe}$. It also produces a lower collector capacitance because of the stretched depletion region. It is therefore concluded that some collector stretching is beneficial, except that the transit-time of carriers across the collector depletion region is increased. Ideally, then, the BICMET should be designed to operate as close to the collector stretching limit as possible while still achieving tolerable collector transit times.

Figure 30:
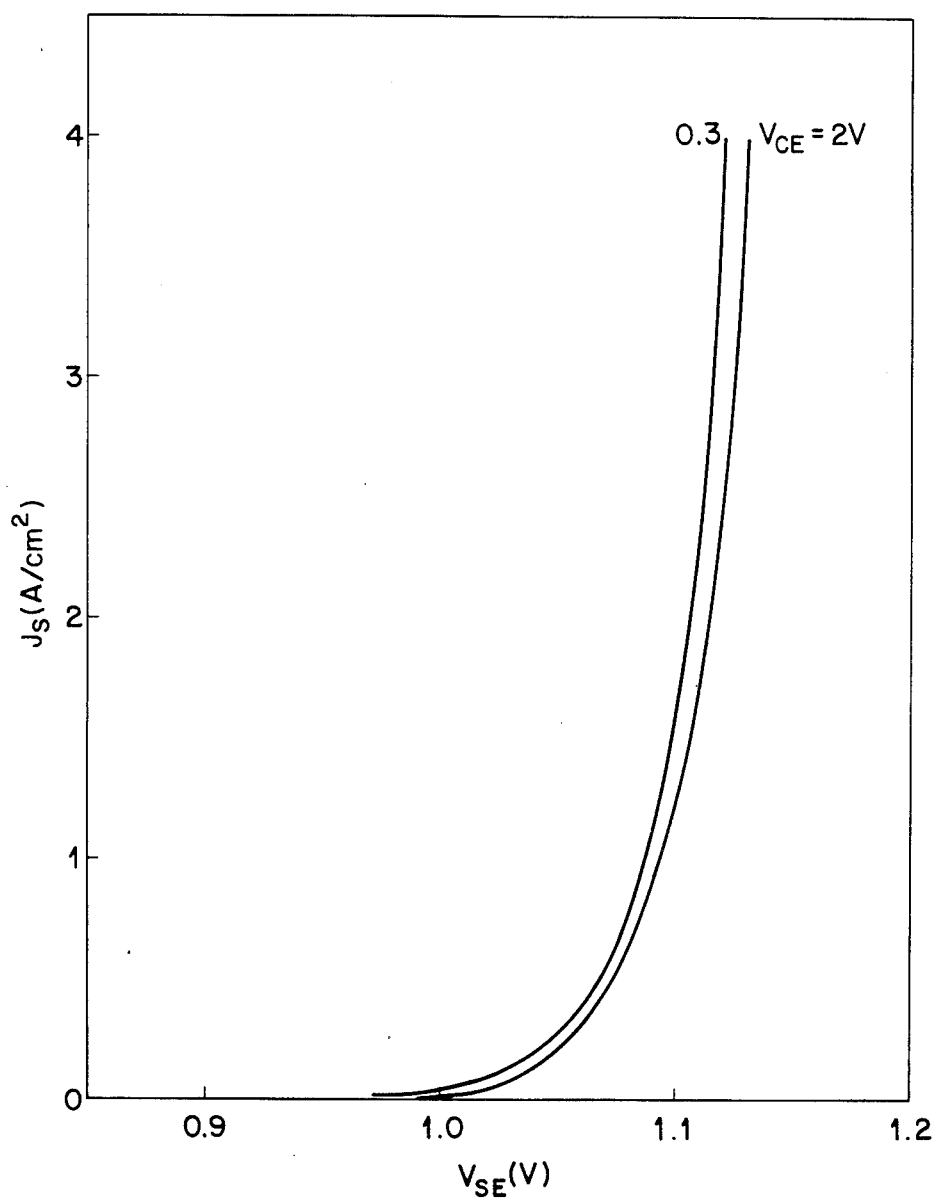
Figure 31:
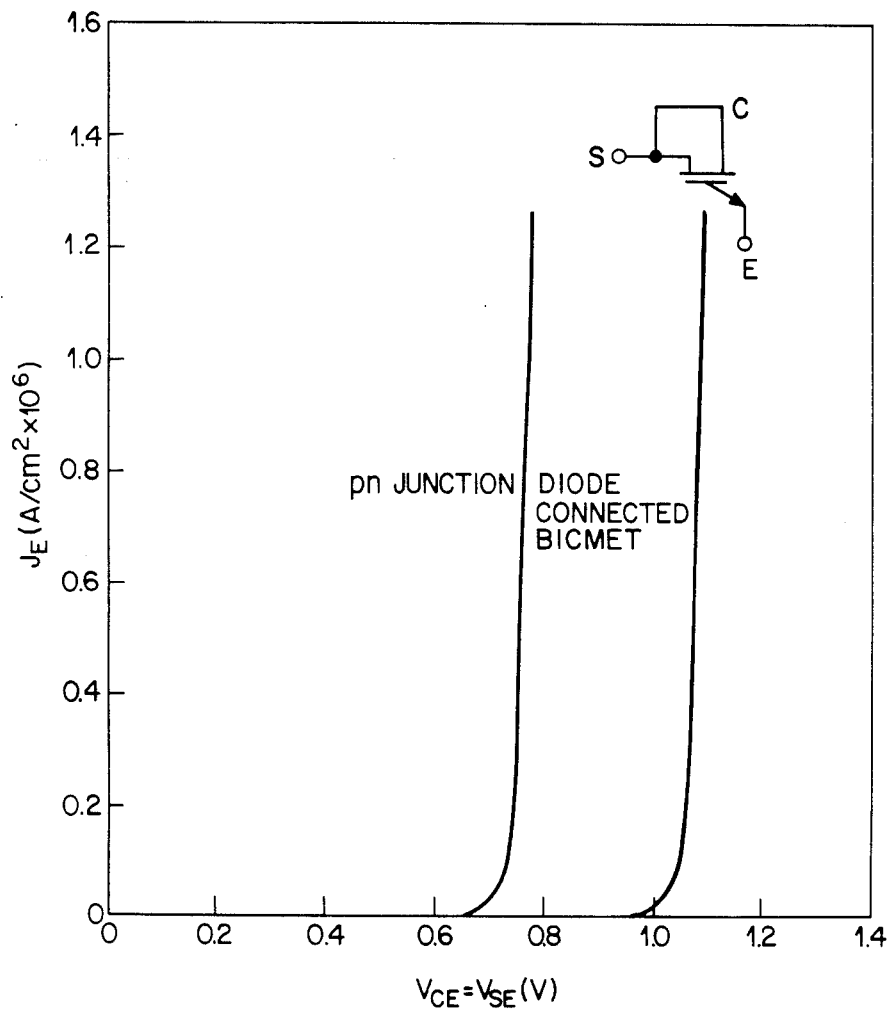
FIG. 31 shows a diode connected BICMET and characteristic.

FIGS. 24, 30 and 31 show the common-emitter transfer chracteristic, the source input characteristic and the diode-connected device characteristic (i.e., with the source and collector as a common terminal) for the BICMET in FIG. 27. The designated symbol for the device is shown in the inset in this figure. The double line of the MOST is used to indicate that the semi-insulator is still a high impedance to the base input. The arrow for the emitter is analogous to the bipolar, indicating a high current lead. The transfer characteristic shows that the current is reduced by collector stretching for a fixed $V_{CE}$ in agreement with FIG. 28. It is noted that the source input characteristic shows no effect of collector stretching, since the source current is controlled independently of the stretching effect.

We now consider the current gain G as a function of source input current and temperature respectively, for the BICMET of FIG. 28. The gain initially decreases with increasing $J_S$, in which range collector stretching is negligible ($J_C<10^6$ A/cm$^2$) but then it begins to increase dramatically as source currents of 4-5 A/cm$^2$ are reached, in which range collector stretching becomes appreciable. At temperature below 200° K., gains in excess of $10^8$ are achievable. (This is obtained for a value of $V_{CE}=1$ V, and the $J_S$ is adjusted to give $J_C=10^6$ A/cm$^2$.) However, the collector current and, hence, transconductance decrease with decreasing temperature. It should be noted here also, that recombination in interface states may well become a limiting factor for current gains $>10^6$ (see Appendix C).

In summary, we have described a new device in which an inversion layer replaces the conventional base, and a metallic emitter replaces the conventional semiconductor emitter. The device has very high transconductance, and very high current gain. Also because the device has no base, it has a much lower capacitance than a conventional bipolar transistor. This low capacitance, coupled with the high transconductance, implies very high speed in both digital and analog applications. Because the device has substantially no neutral base to limit scaling in the vertical dimension, as in the bipolar transistor, and because it has no drain to limit its scaling in the planar dimension as in the FET, the BICMET is an ideal candidate for the scaling of lithographic feature sizes into the sub 0.1 μm range. The corresponding improvements in device performance are many. However, one of the most significant is the ability to realize ballistic effects in the channel. This fact alone will aid devices in the III-V technologies to achieve significant performance advantages.

Other Devices

Figure 32:
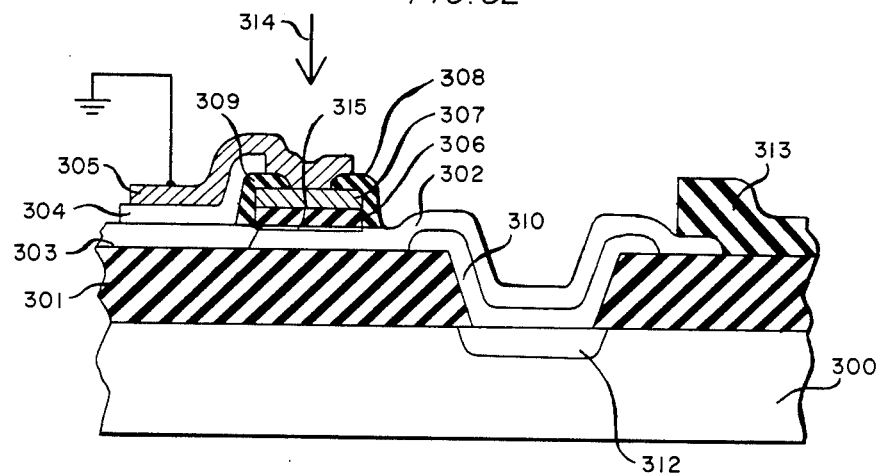
FIG. 32 shows a BICMET photodetector cross-section (in Si).

Another application of the inventive structure is as a photodetector. Referring to FIG. 32, a long wavelength optical detector is implemented in silicon technology. A thin film of germanium (302, 303) having a sufficient thickness to absorb optical energy is located on SiO$_2$ layer 301, which is located on Si substrate 300. The P+ Ge channel contact region 303 accesses the inversion layer, and is connected to the metallic emitter region 305 through a SIPOS layer 304, which serves as a resistor. The metallic emitter 305 can be a very thin metal layer, of a transparent conductive oxide (e.g., indium oxide or tin oxide). Alternately, the metal contact (region 305) can be only around the periphery, and electrical contact over the SIPOS semi-insulator 306 surface can be made by a silicide or transparent oxide layer (307), or a heavily implanted degenerate surface doping of the SIPOS layer. (The regions are insulated by deposited SiO$_2$ layers 308, 309.) The incident optical energy (314) then can penetrate through to the inversion layer (315), and into the N+ Ge collector region (302). The collector is connected to a positive potential power contact (region 312) through a second SIPOS resistor region (310). The signal output is fed to an amplifier from metal contact 313.

The operation is as follows: The SIPOS resistor (304) is connected between the P+ Ge base contact of the BICMET and its metal emitter (305) to determine the high frequency response of the photodetector. When light is absorbed in the Ge depletion region, the transfer of holes to the Ge/SIPOS interface, and of electrons to the Ge N+ contact, is very fast, being limited only by the saturated drift velocity in the Ge. However, when the illumination is decreased, the excess holes at the interface cannot be removed very quickly by conduction of the very small current through the SIPOS layer. Therefore, an alternate conduction path must be provided for them, which is accomplished by the resistor (304). The speed of the device is determined by the time constant of the resistor and the SIPOS capacitance. In this embodiment, the inversion layer is considered to control the flow of majority carriers from emitter to collector by thus providing this alternate conduction path.

Of course, the current gain of the device is also decreased by this resistor (304), so bandwidth (speed) can be directly traded for gain, since the gain-bandwidth product is fixed for the device. However, the gain-bandwidth product for the BICMET is exceedingly high, so the resistor can be chosen to obtain a decent gain (say G=100) at a frequency higher than conventional phototransistors. It is noted that the resistor is comparable to the speed-up capacitor and resistor in conventional bipolars, which is used to extract holes from the base when the base signal goes to ground (measuring base pulse response). In the arrangement shown here, we are using the internal capacitance of the barrier layer, and taking the resistor to the most negative potential in the system, which is the emitter ground.

Several comments are in order about the benefits of such a photodetector:

This arrangement could be used for any wavelength of light simply by choosing the collector material to have the appropriate absorption spectrum. Therefore, one can consider InSb or HgCdTe, etc. for even longer wavelength response. For shorter wavelength response, one can of course use Si or other materials.

The characteristic feature of the BICMET photodetector is that of a gain which is highest at the lowest currents and decreases for very high current levels. This is exactly what we desire for the BICMET as a photodetector because we would like the detector to operate in the dark with only the leakage current flowing. That is, we do not want large currents to flow in the device in the quiescent condition. Large currents are usually necessary in the case of conventional heterojunction bipolar transistors to obtain a large current gain.

Also, the BICMET photodetector may be made so that the inversion layer forms upon application of the operating voltage; i.e., without depositing charge at the interface during device construction. The increase of $V_{CE}$, cut-in obtained thereby is of typically little consequence for the photodetector.

Figure 33:
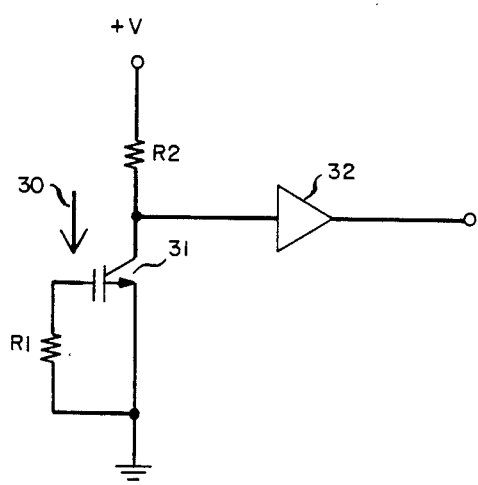
FIG. 33 shows the equivalent circuit for the photodetector connected to an amplifier.

The equivalent circuit of the structure of FIG. 32 is shown in FIG. 33, wherein resistor $R_1$ corresponds to SIPOS layer 304 of FIG. 32, and load resistor $R_2$ corresponds to layer 310. The gain of the device can be varied by changing $R_1$. For example, the channel of a field effect transistor can serve as $R_1$, which can then be controlled by a voltage applied to the gate. A very wide range of optical power levels can thus be detected without overload to the detector or amplifier 32.

Figure 34:
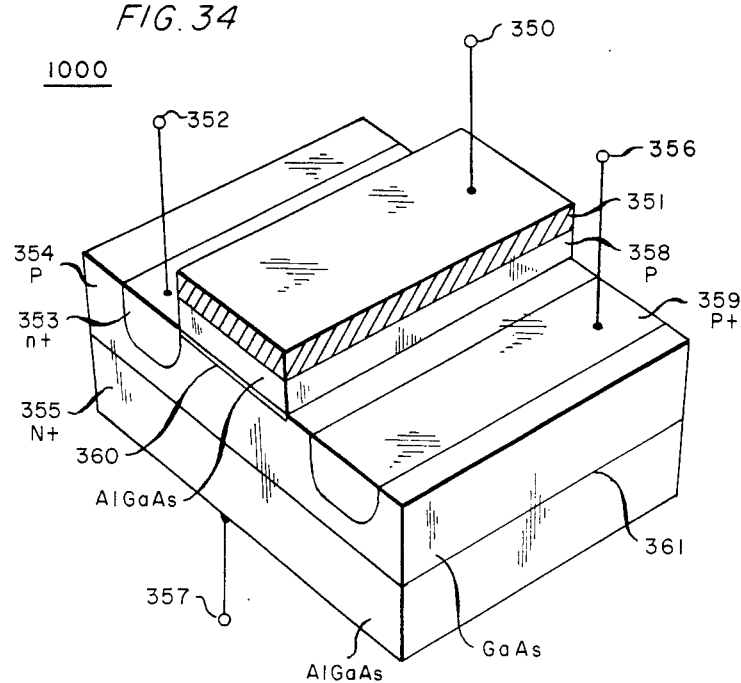
FIG. 34 shows a BICMET optical emitter.

Referring now to FIG. 34, there is illustrated an isometric view of a device structure 1000 comprising the BICMET structure and additional region 355. This device can behave as a pnpn thyristor, and can act as either a laser or a light emitting diode, depending on factors including the thickness of the active region, doping levels, bandgaps, and the presence or absence of an optical resonator. Structure 1000 can be designed to be a normally "ON" or normally "OFF" device. Structure 1000 is illustrated as being formed on an n-type semiconductor substrate 355 and is denoted as a n-channel device. Structure 1000, when formed with a p-type substrate, is denoted as a p-channel device. The p-channel device is analogous to the n-channel device and, accordingly, will not be discussed in any detail. Both the p-channel and n-channel devices could be constructed essentially upside down with identical layers arranged in reverse order to what is illustrated.

In one embodiment in which light is emitted, structure 1000 is a current-controlled device which when built as a n-channel device essentially comprises a n+-type conductivity semiconductor substrate (body) 335, a p-type semiconductor region (layer) 354 (which may be denoted as a collector region), a relatively thin n-type semiconductor region (layer) 360 (which may be denoted as a channel layer or an inversion channel), a p-type semiconductor region (layer) 358, a metallic layer 351, a localized n+-type contact region 353, and a localized p+-type contact region 359. Terminals 350, 352, 357, and 356 are coupled to metallic layer 351, region 353, substrate 355, and region 359, respectively. Region 358 is a relatively wide bandgap material of p-type conductivity and is sufficiently thin enough to permit thermionic emission therethrough. Metallic region 351, which serves as the anode terminal, is in contact with layer 358 and serves as the anode of structure 1000. Layer 360 is a thin n-type layer which is essentially an inversion channel which separates p-type layer 358 from p-type layer 354. Region 354 is of a relatively narrow typically direct bandgap material and, accordingly, is capable of emitting light. Substrate 355, which has an electrode 357 in ohmic contact therewith, serves as the cathode terminal of structure 1000 and has a relatively wide bandgap compared to collector region 354. This provides for high injection efficiency for junction 361. This condition provides for numerous hole-electron recombinations in region 354, which produces optical emission. Contact localized region 353 is in electrical contact with channel layer 360 and makes ohmic contact to an electrode 352 which serves as a control terminal of structure 1000. Region 359 makes ohmic contact to layer 354 and is in ohmic contact with electrode 356 which serves as a collector terminal of structure 1000. Structure 1000 has both optical (from region 354) and electrical outputs (from region 359) that are both controlled by potentials applied to and current injected into or pulled out of channel region 360. Thus, optical emission and electrical output signals can be rapidly modulated using a relatively low power control signal applied to region 353.

As has been described hereinabove, the BICMET itself is essentially an inversion channel controlled transistor. In the quiescent state, all of the electrodes float in potential and no current flows through the device. Normally in the off state, the device is forward biased from electrode 350 to electrode 357 but there is no current flow out of layer 360 into electrode 352 and, therefore, only relatively small amounts of leakage flow between electrodes 350 and 357. In the on state, the device has a forward bias across electrodes 350 and 357 and electrons are injected into channel layer 360. This injection of electrons increases the forward bias potential across region 358 and thereby facilitates a relatively large flow of current between electrodes 351 and 357. This corresponds to the collector-emitter current through a transistor, with the electron flow into the inversion channel region (layer) 360 corresponding to the input control current.

Figure 35:
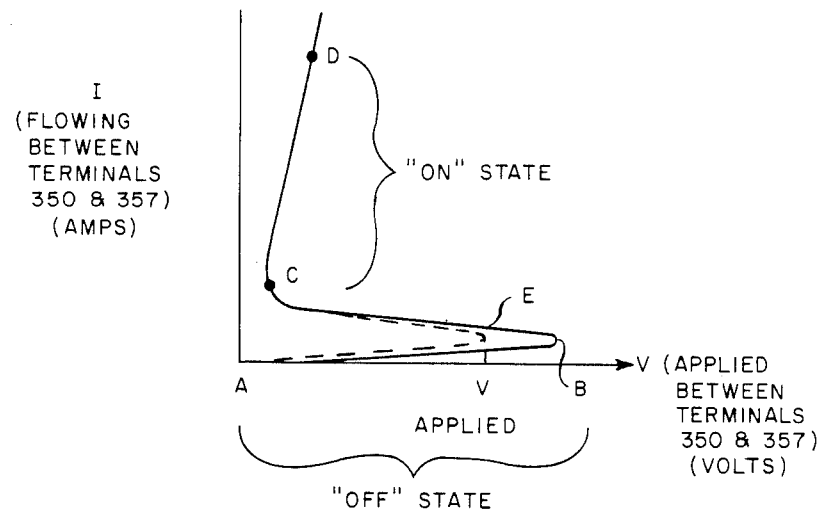
FIG. 35 shows electrical characteristics of a BICMET optical emitter and thyristor.
Figure 36:
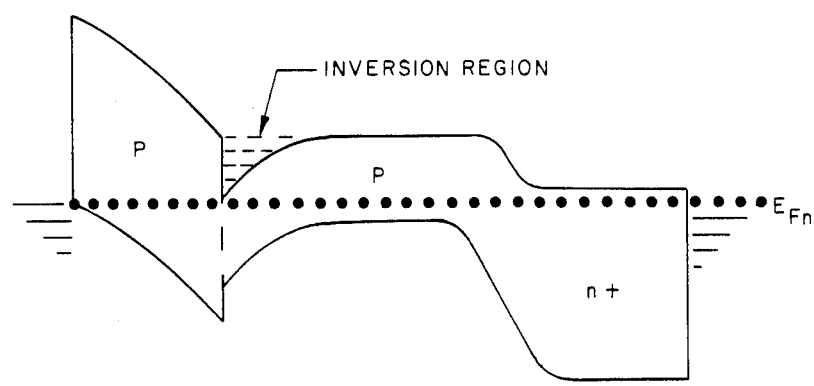
FIGS. 36–38 show energy band diagrams for the structure of FIG. 34.

When structure 1000 functions as a thyristor, there is provided a forward bias between electrode 350, which serves as an anode terminal, and electrode 357, which serves as a cathode terminal. When structure 1000 is in a thermal equilibrium state, there is no bias applied between anode electrode 351 and cathode electrode 357 or between electrodes 352 and 350. The energy band diagram for this mode of operation is illustrated in FIG. 36. For this state, initially no current flows through structure 1000 which is operating at point A or at the origin of one possible current-voltage (I-V) characteristic curve that is illustrated in FIG. 35. The situation where the anode (terminal 350) is forward biased with respect to the cathode (terminal 357), and there is essentially no flow of charge carriers into layer 360, corresponds to the OFF (high impedance) state of the device, as typified by region AB of FIG. 35.

Figure 37:
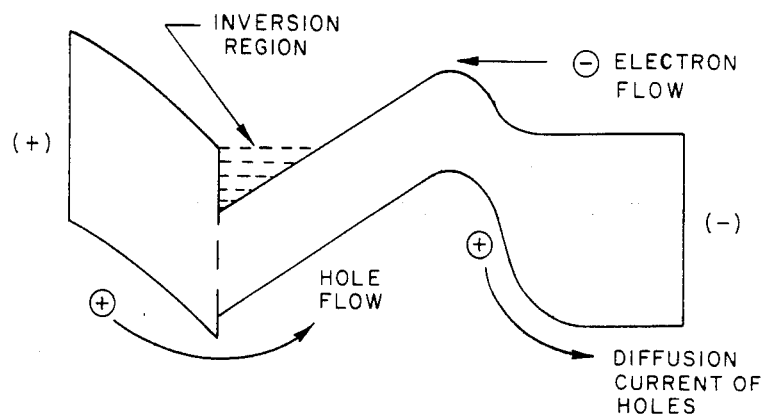
Figure 38:
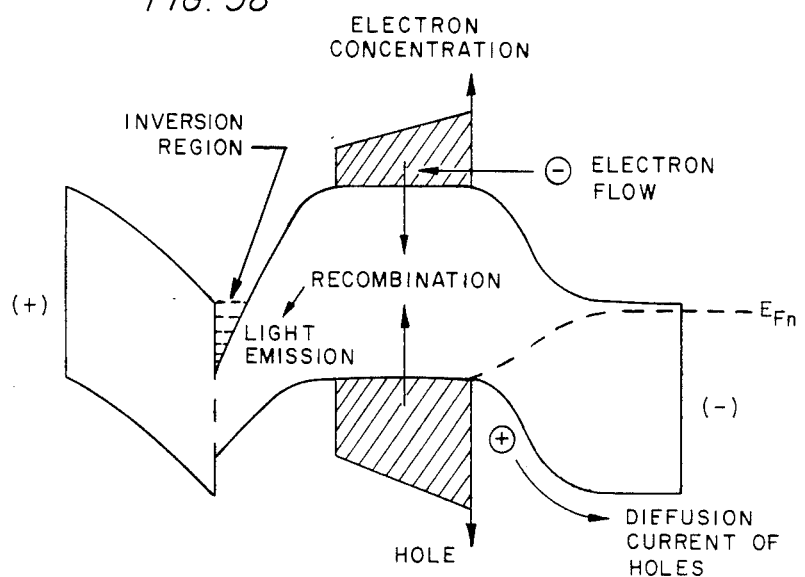

When some source current is injected into channel layer 360, the current from anode electrode 350 to cathode electrode 357 increases and there is an accumulation of holes in relatively narrow bandgap region 354. As the anode-to-cathode current increases, a plasma of charge carriers is built up in region 354, which results in a great enough hole concentration gradient between regions 354 and 355 for diffusion of holes from region 354 to region 355 to begin. This flow of holes in turn gives rise to a flow of electrons in the opposite direction (see FIG. 37) which causes switching action such that the impedance level between terminals 351 and 357 goes from a relatively high resistance, to a relatively low resistance which is illustrated in FIG. 38. Point B on the I-V characteristic of FIG. 35 and the energy band diagram corresponding to switching of FIG. 37 illustrate this action.

In this latter mode of operation, structure 1000 enters a brief phase of negative resistivity as it moves along its characteristic point B to point C. During this portion of the mode of operation, there is relatively low level of recombination of charge carriers in region 354. Point C of the I-V characteristic of FIG. 35 corresponds to the "ON" state of the device. If the channel region 360 current is then increased by a relatively small amount, the collector-emitter current significantly increases due to the fact that the transistor portion of structure 1000 is on and providing current gain. This increase in carriers in layer 354 causes an optical output signal to be emitted from region 354 to correspondingly increase the output current as is illustrated at point D on the I-V curve illustrated in FIG. 35. In this manner, the light level and electrical output signal may be modulated.

The nature of a light emitted by structure 1000 and the direction in which it is emitted are functions of the overall geometry of the structure. The described structure 1000 produces at least incoherent light that may be directed into a waveguide (not shown) coupled to region 354 in a number of ways well known in lightwave technology. Lasing can be achieved by creating a resonator cavity between any two exposed and parallel facets of region 354, (i.e., the surface facing the observer of FIG. 34, and the parallel facet which is hidden directly behind, such that both are optically semi-reflective and semi-transparent). With structure 1000 being used as a laser, waveguide couplings to the second region can be made via either of the two parallel cleaved facets.

In one embodiment of structure 1000 which emits light, layers 354 and 360 are both gallium arsenide and layer 358 and substrate 355 are both aluminum gallium arsenide. Region 358 is about 400 angstroms thick and is of $Al_{0.3}Ga_{0.7}As$ that has been p-doped to a concentration of $10^{18}$ cm$^{-3}$. Region 354 is about 0.5 $\mu$m thick and is of GaAs that has been p-doped to a concentration of $10^{17}$ cm$^{-3}$. Region 355 is about 0.5 $\mu$m thick and is of $Al_{0.3}Ga_{0.7}$ that has been n+-doped to a concentration of $5\times10^{18}$ cm$^{-3}$. Channel region 360 is typically 30 angstroms thick and is of GaAs that has been n+-doped to a concentration of at least $10^{19}$ cm$^{-3}$. Channel region 360 can be thicker, up to several hundred angstroms. Response times would tend to degrade as the thickness of region 360 increases.

In one presently believed preferred embodiment, the thickness of region 360 would be approximately several to 150 angstroms. Metallic emitter 351 is approximately 3000 to 4000 angstroms thick. Structure 1000 may be mesa etched along two parallel planes. The first plane would be perpendicular to the layer structure of the device and ends such that layer 354 is exposed while the second plane is parallel to the first and extends beyond the depth of the region 354. Contact regions 353 and 359 are typically formed by ion implantation. Contact region 359 is optional when structure 1000 is used as a thyristor.

The solid curve of FIG. 35 illustrates the I-V characteristic which structure 1000 exhibits if there are only changes in the anode-to-cathode forward biasing voltage, as is the norm in thyristor switching. In this case, point A, the origin, corresponds to the quiescent state of structure 1000 wherein all the potentials of contacts (electrodes) are floating. The positive slope line segment between points A and B corresponds to the effect of increases in the forward bias from the anode to the cathode of structure 1000. Inflection point B corresponds to switching as the biasing potential difference is large enough to cause punchthrough in region 354 after which the device would enter into a brief phase of negative resistivity corresponding to the negative slope line segment between point B and a second inflection point, C. The positive slope line segment of the characteristic which follows is the operating region of the device whose points C and D correspond to the high and low levels of a modulated output signal, respectively. Modulating between these two states is controlled by small changes in the voltage applied between the anode (electrode 351) and cathode (electrode 357) which cause relatively large changes in current flow through structure 1000 and the emission of light.

In contrast, however, dotted path E illustrates the use that injected channel current has on the switching characteristic, as compared to controlling the anode-cathode voltage. As previously stated, structure 1000 is intended to switch when the accumulation of majority carrier plasma in region 354 induces the diffusion of holes from region 354 to region 355 which in turn causes a reciprocal diffusion of electrons to flow from region 355 to region 354. Because the anode to cathode potential difference is to be held constant for this device, mechanism used in the light emitter/BICMET/thyristor for initially creating, maintaining, and modulating the necessary majority carrier plasma build-up is that of increasing the emitter-collector current of the device via the injection of channel current. In this case, the higher the channel current, the larger the plasma build-up and the lower the anode to cathode potential difference required for switching. Thus, by increasing the injected channel current, one can bring the switching voltage of the device down to that of its forward bias. After switching point E, the characteristic follows the solid curve as previously described through a phase of negative resistivity to point C from which modulation between it and D is controlled via changes in the source current.

Structure 1000 can be designed with sufficiently high current gain such that with a forward bias applied between terminals 351 and 357 and with no current supplied to channel region 360, structure 1000 is in an "ON" state and conducts current between terminals 351 and 357. The amount of current flow, with no current supplied to channel region 360, is determined by the bandgaps of the different regions and the substrate. The application of a voltage and current to terminal 352 acts to modulate the current flow between terminals 31 and 357 and the light emitted from region 354.

Figure 39:
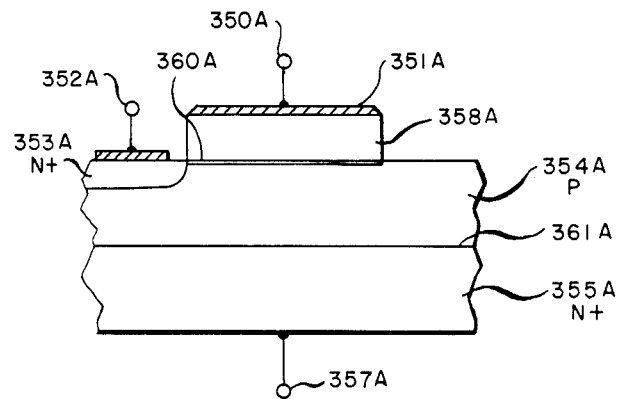
FIG. 39 shows a BICMET thyristor.

Referring now to FIG. 39, there is illustrated in a cross-sectional view a thyristor structure 1000A which is very similar to structure 1000 of FIG. 34. Regions of 1000A which are similar or identical to corresponding regions of structure 1000 of FIG. 34 are denoted with the same reference number with an "A" added thereafter. The major difference between structures 1000 and 1000A is that contact region 359 and terminal 356 do not exist in structure 1000A and the bandgap of region 355A is typically the same as region 354A. Structure 1000A acts as a pnpn silicon controlled rectifier (SCR) but is not adapted to provide a light or electrical output signal from region 354A. The response time of structure 1000A is believed better than that of conventional SCR's. In silicon SIPOS technology, structure 1000A would be typically fabricated as a p-channel device, with the regions and substrate having opposite conductivity types of those illustrated.

APPENDICES

Appendix A. The System Under Bias

A.1 Voltage and Charge Equations

FIG. 3 illustrates the BICMET under voltage bias and with a channel current flowing. The collector-emitter voltage, $V_{CE}$, is given by (all variables with the superscript * refer to their respective equilibrium values):

$$V_{CE} = V_i - V_i^* + \phi_s - \phi_s^* = V_i - \Psi_{ms} + \phi_s \quad (A1)$$

where $V_i$, the voltage drop in the semi-insulator, is given by $$V_i^* = -\frac{Q_e^*}{C_i} \quad (A2a)$$

$$V_i = -\frac{Q_e}{C_i} \quad (A2b)$$

where $C_i$ is the capacitance of the semi-insulator. Under bias, the charge equation is $$Q_e = Q_{ep} + Q_{eB} = -(Q_i + Q_s) \quad (A3)$$

and $Q_i$ is given by $$Q_i = \frac{-qN_i}{1 + e^{(\epsilon_p - \Delta E_i)/kT}} \quad (A4)$$

where $\Delta E_i$ is the position of the Fermi level at the interface under bias and given by $$\Delta E_i = \frac{kT}{q} \ln\left(\frac{N_i}{p_o}\right). \quad (A5)$$

$Q_s$ is the charge in the semiconductor given by (see (B8))

$$Q_s = \left(\frac{2\epsilon_s q}{\beta}\right)^{\frac{1}{2}} \left(p_o + \beta\phi_s\left(N_d - \frac{J_{ni}}{qv_s}\right)\right)^{\frac{1}{2}}. \quad (A6)$$

Following (A6), the equilibrium value of semiconductor charge $Q_s^*$ is given by $$Q_s^* = \left(\frac{2\epsilon_s q}{\beta}\right)^{\frac{1}{2}} (p_o^* + N_d\beta\phi_s^*)^{\frac{1}{2}}. \quad (A7)$$

The channel-emitter voltage $V_{SE}$ is given by $$\begin{aligned} V_{SE} &= E_{Fm} - E_{Fpo} \\ &= \Delta V_i + \frac{\Delta E_i^*}{q} - \frac{\Delta E_i}{q} \\ &= \Delta V_i + \beta^{-1}\ln(N_v/p_o^*) - \beta^{-1}\ln(N_v/p_o) \\ &= \Delta V_i + \beta^{-1}\ln(p_o/p_o^*) \end{aligned} \quad (A8)$$

where $\Delta V_i$ is the voltage drop $V_i$-$V_i^*$ in the semi-insulator. The collector-source voltage $V_{CS}$ is given by $$\begin{aligned} V_{CS} &= V_{CE} - V_{SE} \\ &= V_{CE} - \Delta V_i - \beta^{-1}\ln(p_o/p_o^*) \end{aligned} \quad (A9)$$

or $$V_{SC} = \Delta V_i + \beta^{-1}\ln(p_o/p_o^*) - V_{CE}.$$

Further justification is helpful at this point of equation (A2). There are two cases one can generally consider for the details of conduction of the barrier layer.

In the first case the doping of the barrier layer is uniform and the zero bias depletion width is equal to the width of the barrier layer. Then as the forward bias is increased the depletion width decreases and the capacitance associated with the depletion width increases. Of course, when this happens there is considerable current flowing and so there is also a voltage drop between the edge of the barrier layer and the emitter contact. There is a capacitance associated with this section and so the total capacitance will be the series combination of the two parts. In this case (A2) cannot apply because the capacitance $C_i$ will be less than the insulator capacitance and will be voltage dependent.

In the second case, the doping is rapidly varying with position so that just at the contact it is very high (the material is degenerate) but is rapidly decreasing as we approach the semiconductor. This kind of profile is to be expected for an ion implanted barrier layer. For this situation, if the zero bias depletion width is just equal to the thickness of the barrier layer then it will remain so as bias is applied because the doping at the depletion edge is so high; that is, all of the charge required to bias the barrier layer is supplied by very small movements of the depletion edge at the emitter contact. In effect, the depletion edge is pinned to the emitter contact and so the correct capacitance to use in (A2) is $C_i$, the insulator capacitance. However, when a space-charge maximum appears in the semi-insulator the situation changes and the capacitance will increase as noted in A.2.2.

Let us estimate the extent to which the depletion width is fixed. Assume that at the emitter contact, the doping is $N_{di} \approx 10^{19} cm^{-3}$. If a voltage $V_i \approx 1.2$ V is applied the charge required on the emitter is $\Delta Q = C \Delta V_i$ and $\Delta Q = 3 \times 10^{-7}$ coulombs $cm^{-2}$ if we assume the geometrical $C = 2.5 \times 10^{-7} F dcm^{-2}$. Since this charge is near the emitter then $\Delta Q = q N_{di} \Delta x$ and so $\Delta x \approx 19$ angstroms. Therefore all of the charge is within about 20 angstroms of the emitter, and becomes even more localized the higher $N_{di}$ can be made. This situation is the one we consider in A.2.

A.2 Current Equations For Barrier Layer

There are two regions of operation to be considered: (a) when space charge does not influence the transport of charge through the semi-insulator, that is, before a space charge maximum appears in the semi-insulator energy diagram which is the condition $\Delta V_i \lesssim \Phi_c$; (b) when a space-charge maximum $\Phi_M$ appears in the energy diagram of the semi-insulator, that is, when $\Delta V_i \gtrsim \Phi_c$. In the former case the current flow is diffusion or thermionic-limited depending on whether the barrier layer is greater or less than the mean free path of the carrier in the barrier layer. In the latter it is space-charge-limited by the barrier presented by $\phi_M$.

A.2.1 Diffusion/Thermionic-Limited Operation

The electron current ($J_{ni}$) flow through the barrier layer may be represented generally by $$J_{ni} = q\mu_n n(x) E(x) + qD_n \frac{dn(x)}{dx} \quad (A10)$$

$$= -q\mu_n n(x) \frac{dV(x)}{dx} + qD_n \frac{dn(x)}{dx}.$$

Since the current is independent of x we can write (A10), using $\exp[-\beta V(x)]$ as an integrating factor, in the form $$n(x)\exp[-\beta V(x)] \Big|_0^d = \frac{J_{ni}}{qD_n} \int_0^d \exp[-\beta V(x)]dx. \quad (A11)$$

The boundary conditions are $$V(o) = -\Phi_n/q, \ n(o) = N_c \exp(-\Phi_n/kT)$$

$$V(d) = -\left(\frac{\Phi_c}{q} \Delta V_i\right), \ n(d) = \frac{-J_{ni}}{qv_{tn}}$$

where $v_{tn}$ is the average electron energy in a direction perpendicular to the barrier layer/semiconductor interface and $\Phi_n$ is the small but finite energy barrier at the metal/semi-insulator interface. Using the boundary conditions an equation is obtained which may be solved for $J_{ni}$ to yield $$J_{ni} = \frac{-qv_{tn}N_c}{\frac{v_{tn}}{D_n} \int_0^d e^{-\beta V(x)} dx + e^{(\Phi_c - q\Delta V_i)/kT}}. \quad (A12)$$

The integral in (A12) cannot be completed in closed form. However, we may rewrite it approximately $$\int_0^d \exp[-\beta V(x)]dx = -\int_{V(o)}^{V(d)} \frac{1}{E(x)} \exp[-\beta V(x)]dV \approx \quad (A13)$$

$$-\frac{1}{\hat{E}} \int_{V(o)}^{V(d)} \exp[-\beta V(x)]dV$$

where $\hat{E}$ is an average value of the electric field over the semi-insulator thickness. It is this approximation and the one for $\hat{E}$ below which are valid only for the case of the effectively constant depletion width. The approximation should be a good one because $\hat{E}$ appears only in the pre-exponential term. Evaluating (A13) and substituting into (A12) yields for $J_{ni}$, $$J_{ni} = \frac{-qv_{tn}N_c e^{-(\Phi_c - q\Delta V_i)/kT}}{\frac{v_{tn}}{D_n \beta s cr E h} |1 - e^{-(\Phi_c - \Phi_n - q\Delta V_i)/kT}| + 1} \quad (A14)$$

We can write as an approximation $$\hat{E} \approx \frac{\Phi_c - \Phi_n - q\Delta V_i}{qd}$$

and since we know that $$D_n \approx V_{tn} l_n \quad (A15)$$

where $l_n$ is the mean free path of carriers in the semi-insulator, then (A14) may be written $$J_{ni} = \quad (A16)$$

$$\frac{-qv_{tn}N_c e^{-(\Phi_c - q\Delta V_i)/kT}}{\frac{dkT}{(\Phi_c - \Phi_n - q\Delta V_i) l_n} |1 - e^{-(\Phi_c - \Phi_n - q\Delta V_i)/kT}| + 1}.$$

Let us consider the limits of (A14) for low and high values of applied insulator voltage $\Delta V_i$. For small $\Delta V_i$, $\exp[-(\Phi_c - \Phi_n - q\Delta V_i)/kT] << 1$ the denominator of (A16) becomes $$\frac{dkT}{(\Phi_c - \Phi_n)l_n} + 1. \quad (A17)$$

For large $q\Delta V_i \approx \Phi_c - \Phi_n$, the denominator of (A16) becomes, by expanding the exponential term, $$d/l_n + 1. \quad (A18)$$

Generally speaking $\beta(\Phi_c - \Phi_e)/kT >> 1$, so that the use of (A18) would represent the worst case situation, i.e., it would predict lower than actual currents at the lower voltage levels. Since we are most interested in high current levels then we may use (A18) in the denominator or (A16) for all voltage levels bearing in mind that the actual currents could be higher for lower voltage levels:

$$J_{ni} = \frac{-qv_{tn}N_c e^{-(\Phi_c - q\Delta V_i)/kT}}{\frac{d}{l_n} + 1}. \quad (A19)$$

The interesting feature of this form is that it combines thermionic-limited and diffusion-limited conduction for since, if $l_n \gg d$, $J_{ni}$ becomes $$\vec{J}_{ni} = -qv_{tn}N_c e^{-(\Phi_c - q\Delta V_i)/kT}$$

which may be written in the form $$J_{ni} = -A^* T^2 e^{-\Phi_c/kT} e^{\beta \Delta V_i} \quad (A20)$$

where A* is Richardson's constant. This result is simply thermionic emission associated with the barrier of height $\Phi_c - \Delta V_i$. On the other hand if $l_n \ll d$, (A19) may be written $$\vec{J}_{ni} = \quad (A21)$$

$$-q \frac{v_{tn}}{d} l_n N_c e^{-(\Phi_c - q\Delta V_i)/kT} = -q \frac{D_n}{d} N_c e^{-(\Phi_c - q\Delta V_i)/kT}$$

which is simply the diffusion current associated with a barrier height of $\Phi_c - \Delta V_i$.

In a similar manner we can find the current of electrons from the collector to the semi-insulator to be $$\overleftarrow{J}_{ni} = \frac{-qv_{tn}N_c}{1 + d/l_n} e^{-(\Phi_c - q\Delta V_i)/kT} e^{-\beta V_{CE}}.$$

Since $e^{-\beta V_{CE}} \ll 1$ for normal operating conditions, $$J_{ni} = q(\vec{J}_{ni} - \overleftarrow{J}_{ni}) = \frac{qv_{tn}N_c}{1 + d/l_n} e^{-(\Phi_c - q\Delta V_i)/kT}$$

which may be written $$J_{ni} = qv_n N_c e^{-(\Phi_c - q\Delta V_i)/kT} \quad (A22)$$

where $v_n$ is an effective velocity for electrons:

$$v_n = \frac{v_{tn}}{1 + d/l_n}$$

and the negative sign for the current has been discarded. The hole current follows directly from (A18) by substituting $N_v$ for $N_c$ and the barrier to holes ($\Delta E_i + \Delta E_v - qV_i$, see FIG. 3) measured from $E_{Fpo}$ (Fermi level for holes at the interface) for $\Phi_c - q\Delta V_i$, the barrier to electrons measured from the metal Fermi level $E_{Fm}$:

$$J_{pi} = \frac{qv_{tp}N_v e^{-(\Delta E_i + \Delta E_v - qV_i^* - q\Delta V_i)/kT}}{1 + d/l_p}. \quad (A23)$$

Note that $p_o = N_v e^{-\Delta E_i/kT}$ so that (A23) reduces to $$J_{pi} = \frac{qv_{tp}p_o e^{-(\Delta E_v - qV_i^*)/kT} e^{\beta \Delta V_i}}{1 + d/l_p} = \quad (A24)$$

$$qv_p p_o e^{-(\Delta E_v - qV_i^*)/kT} e^{\beta \Delta V_i}$$

-continued where $v_p = \frac{v_{tp}}{1 + d/l_p}$ is an effective velocity for holes.

A.2.2. Space-charge-limited operation

In this mode of operation, since the field in the semi-insulator is very high ($\gtrsim 10^5$ V/cm) we assume that the electron velocity is saturated. Thus, we have for the space charge density $\rho_s$ in the semi-insulator $$\rho_s = q(N_{di} - J_{ni}/(v_s q)) \quad (A25)$$

where $J_{ni}/(v_s q)$ is the constant space charge contribution of the current and $N_{di}$ is the donor density in the semi-insulator. Substituting (A25) into Poisson's equation we have $$\frac{dE}{dx} = \frac{q}{\epsilon_i}\left(N_{di} - \frac{J_{ni}}{qv_s}\right) = \frac{q}{\epsilon_i} N_{di}' \quad (A26)$$

where $$N_{di}' = N_{di} - \frac{J_{ni}}{qv_s}. \quad (A27)$$

Using the boundary condition E=0 at $x = x_m$ where $x_m$ is the maximum of the space charge potential measured from the emitter contact, (A26) integrates to $$-\frac{d\Phi}{dx} = E = \frac{q}{\epsilon_i} N_{di}'(x - x_m) \quad (A28)$$

Integrating (A28) using the boundary condition that $\Phi = 0$ at $x = 0$ gives $$\phi = -\frac{q}{\epsilon_i} N_{di}'\left(\frac{x^2}{2} - xx_m\right). \quad (A29)$$

$\Phi_m$ is determined by substituting $x = x_m$ in (A29)

$$\Phi_m = \frac{qN_{di}' x_m^2}{\epsilon_i 2}. \quad (A30)$$

We now determine $x_m$ from (A29) using the boundary condition $\phi = \Delta V_i - \Phi_c$ at $x = d$ which gives $$x_m = \frac{d}{2} + \frac{(\Delta V_i - \Phi_c)}{d} \frac{\epsilon_i}{qN_{di}'}. \quad (A31)$$

It is interesting to note from (A31) that when $\Delta V_i = \Phi_c$ then $x_m = d/2$ independent of $N_d$ or $J_{ni}$. Substituting (A31) into (A30) yields $$\Phi_m = \frac{q}{2\epsilon_i}\left(N_{di} - \frac{J_{ni}}{qv_s}\right)\left(\frac{d}{2} + \frac{(\Delta V_i - \Phi_c)}{d} \frac{\epsilon_i}{qN_{di}'}\right)^2. \quad (A32)$$

The current through the semi-insulator is now given by (A19) with the barrier to electrons ($\Phi_c - \Delta V_i$) replaced by $\Phi_m$ and the thickness of the insulator d replaced by the position of the maximum $x_m$:

$$J_{ni} = \frac{qv_{tn}N_c e^{+\Phi_m/kT}}{1 + \frac{X_m}{l_n}}. \tag{A33}$$

Since $\phi_m$ is a function of $J_{ni}$ then (A33) is clearly transcendental.

Without space charge, then biasing the semi-insulator by an amount $\Delta V_i$ changes the total stored charge $Q_{st}$ in the system by an amount $\Delta V_i C_i$. With space charge present we determined the effect of the space charge on $Q_{st}$ by determining the change of charge, $\Delta Q$, at $x=d$ (i.e. at the interface) when a bias $\Delta V_i$ is applied across the semi-insulator, $$\Delta Q_i = \epsilon_i E(d) + \Phi_c C_i = (E(d) + \Phi_c/d)\epsilon_i$$

where $E(d)$ is the field at $x=d$. Using $x=d$ in (A28) and substituting $x_m$ from (A31) yields $$\begin{aligned}\Delta Q &= \frac{qN_{di}'d}{2} + \frac{\Delta V_i \epsilon_i}{d} \\ &= \frac{qN_{di}'d}{2} + \Delta V_i C_i.\end{aligned}$$

The term $V_i C_i$ is just the contribution of the geometric capacitance to $\Delta Q$; therefore, $qN_{di}'d/2$ is the contribution of the space charge. We may associate a capacitance $C_{si}$ with this space charge given by $$C_{si} = \frac{qN_{di}'d}{2\Delta V_i} \tag{A34}$$

$C_{si}$ thus appears in parallel with $C_i$.

In order to illustrate the nature of the transition from barrier-limited to space-charge-limited conduction in the barrier layer the results (A19) and (A33) have been plotted as a function of applied voltage in FIG. A2. A sharp break in the curve is seen as the space-charge limited effects become important. The slope of this curve which corresponds to the $g_m$ of the device is shown in FIG. A3 and is seen to reach a maximum of $\sim 4 \times 10^7 \text{A/V cm}^{-2}$.

From this result it would seem always desirable to operate near the knee of the current vs. voltage curve since the $f_T$ of the device would be a maximum there.

It will be noted that for voltages above the knee the capacitance also increases due to the space-charge component (A34).

APPENDIX B. CHARGE EQUATIONS

B.1 Total Semiconductor Charge, $Q_2$

Poisson's equation at any plane x in the depletion region of the semiconductor is given by $$\frac{d\epsilon(x)}{dx} = \frac{q}{\epsilon_s}\left(p(x) + N_d - \frac{J_c}{qv_d}\right) \tag{B1}$$

where x is measured from the semi-insulator/semiconductor interface. The free hole concentration $p(x)$ may be written in the form $$p(x) = p_0 e^{-\beta \phi(x)} \tag{B2}$$

where $\phi(x)=0$ and $p(x)=p_o$ at the semiconductor interface and $\phi(x)=\phi_s$ at the edge of the depletion region.

The term $J_{ci}/qv_s$ is the constant space charge contribution of the collector current, which has the effect of reducing the donor charge, and of stretching the width of the collector region. This term also effectively determines the maximum collector current density that can flow, since $N_d - (J_c/qv_s) > 0$ or $$J_c < qv_s N_d. \tag{B3}$$

Otherwise $\phi_s < 0$, a condition that cannot be sustained. The inequality shows that in order to have very large collector currents, $N_d$ must be very large. For example, in order to achieve collector currents of the order $10^6$ amp/cm$^2$ which we would desire for logic applications then $N_d > 10^6/(1.6 \times 10^{-19} \times 10^7) > 6 \times 10^{17}$ cm$^{-3}$ Substituting (B2) in (B1) we obtain $$\frac{d\epsilon}{dx} = \frac{q}{\epsilon_s}\left(e^{-\beta\phi} + N_d - \frac{J_c}{qv_s}\right) \tag{B4}$$

which, since $E = -d\phi/dx$ may be written in the form $$-\int_{\epsilon_0}^{0} \epsilon d\epsilon = \frac{q}{\epsilon_s} \int_{0}^{\phi_s} \left(p_o e^{-\beta\phi} + N_d - \frac{J_c}{qv_s}\right) d\phi \tag{B5}$$

where the integration has been carried out from the interface, where $\epsilon = \epsilon_0$ and $\phi = 0$, to the edge of the depletion region, where $E = 0$ and $\phi = \phi_s$. Evaluating the integral yields $$\epsilon_0^2 = \frac{2q}{\beta\epsilon_s}\left|p_o(1 - e^{-\beta\phi_s}) + \beta\phi_s\left(N_d - \frac{J_c}{qv_s}\right)\right|. \tag{B6}$$

The charge $Q_s$ in the semiconductor is related to $E_o$ by $$Q_s = \epsilon_s \epsilon_0. \tag{B7}$$

So substituting (B6) into (B5) and noting that $1 >> e^{-\beta\phi_s}$ we arrive at $$Q_s = \left(\frac{2\epsilon_s q}{\beta}\right)^{\frac{1}{2}} \left|p_o + \beta\phi_s\left(N_d - \frac{J_c}{qv_s}\right)\right|^{\frac{1}{2}}. \tag{B8}$$

B.2 Inversion Charge $Q_{inv}$

Figure 7:
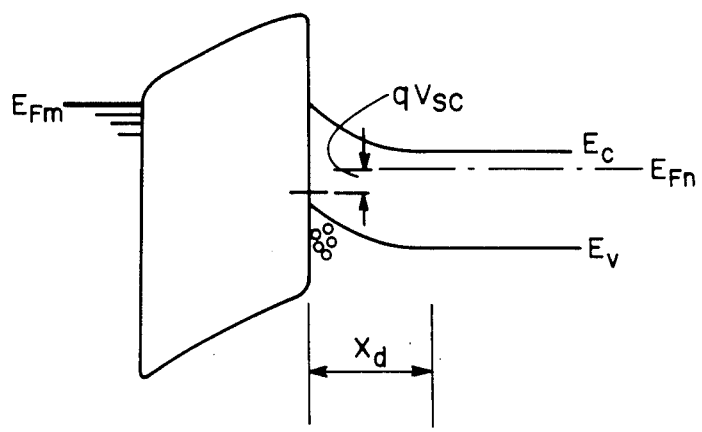
FIGS. 7 and 8 show an energy diagram and hole concentration with distance for the semiconductor depletion region under forward bias.
Figure 8:
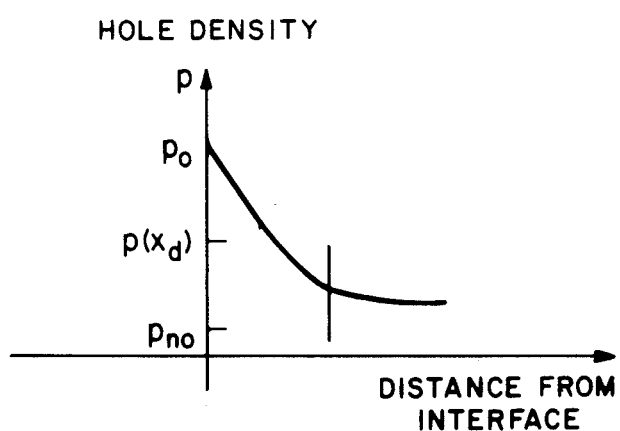

Equation (A3) is the expression for the total semiconductor charge. Often we require the free-carrier stored charge $Q_{inv} - Q_{inv}^*$, which cannot be obtained directly from (A3). However, knowing $p_o$ (or $p_o^*$), $Q_{inv}$ (or $Q_{inv}^*$) may be determined as follows:

The hole charge density at a distance x from the interface is $qp_o e^{-\beta\Phi_x}$ (see FIG. 8) where $\Phi_x$ is the potential of the valence band edge at x (see FIG. 7). Thus, $$Q_{inv} = qp_o \int_o^{\phi_s} e^{-\beta\phi_x} dx \tag{B9}$$

where $\phi_x$ is the potential at a distance x from the interface, of the valence band edge measured with respect to $E_{vo}$, the valence band edge at x=0. Now $$\int_0^{\phi_s} p_o e^{-\beta\phi_x} dx = \int_0^{\phi_s} p_o e^{-\beta\phi_x} \frac{dx}{d\phi_x} d\phi_x$$

where $d\phi_x/dx = \epsilon_x$, and because $e^{-\beta\phi_x}$ falls off rapidly with distance from the interface, we may assume $d\phi_x/dx$ to be constant and equal to its value $E_o$ at the interface; therefore $$Q_{inv} = qp_o \int_0^{\phi_s} e^{-\beta\phi_x} d\phi_x = qp_o \left[ \frac{1 - e^{-\beta\phi_s}}{\xi_o \beta} \right]. \quad (B10)$$

Since $e^{-\beta\phi_s} << 1$ and i $E_o = Q_s/\epsilon_s$ we have from (B10)

$$Q_{inv} = \frac{qp_o \epsilon_s}{\beta Q_s}. \quad (B11)$$

Following (B3) we may write for $Q_{inv}^*$ $$Q_{inv}^* = \frac{qp_o^* \epsilon_s}{\beta Q_s^*}. \quad (B12)$$

Finally, for the free carrier stored charge we have $$Q_{st,i} = Q_{inv} - Q_{inv}^* = \frac{q\epsilon_s}{\beta}\left[\frac{p_o}{Q_s} - \frac{p_o^*}{Q_s^*}\right]. \quad (B13)$$

B.3 Depletion Charge and Depletion Width

We note that $Q_s$ the total semiconductor charge is equal to the sum of the inversion charge, $Q_{inv}$, and depletion charge, $Q_d$; $Q_s = Q_{inv} + Q_d$. Hence, from (B11) we have $$Q_d = Q_s - \frac{qp_o \epsilon_s}{\beta Q_s} \quad (B14)$$

where $Q_s$ is given by (B7).
The width of the depletion region, $\lambda_d$, is now given by $$Q_d = q\lambda_d \left[ N_d - \frac{J_c}{qv_s} \right] \quad (B15)$$

or $$\lambda_d = \frac{Q_d}{q\left[N_d - \frac{J_c}{qv_s}\right]}.$$

Appendix C: Recombination in Interface States

Let N be the number of electrons passing a unit area of the interface per unit area per second. This $N = (J_c/q)$. Thus the capture cross-section area swept out per second is $N\sigma = (J_c \sigma/q)$ where $\sigma$ is the electron capture cross-section. Assuming $N_{ss}$ is the number of interface traps per unit area then the rate of recombination R is $R = N_{ss} \sigma (J_c/q)$.
Hence the recombination current density $$J_R = qR = N_{ss} \sigma J_c.$$

Since $J_s = J_{pi} + J_R$ then the maximum available gain is $$G = \frac{J_c}{J_s} = \frac{J_s}{J_{pi} + J_R} = \frac{J_s}{J_{pi} + N_{it}\sigma J_c} = \frac{G_o}{1 + N_{it}\sigma G_o}$$

where $G_o$ is the gain in the absence of recombination. Clearly recombination will have no effect on the gain if the condition $$G_o << \frac{1}{N_{it}\sigma}$$

is satisfied. We must therefore estimate a reasonable value for $\sigma$. It is noted that the electron spends a time $t_{tr} = r/v$ in the vicinity of the trap where r is the radius of the trap and v is the velocity of the electron moving through the interface:

$$v = \frac{\sqrt{2\left|\Delta E_c + \frac{1}{\beta}\right|}}{m_e}.$$

In order for the electron to be trapped it must spend a time near the trap at least equal to the time $t_{ph}$ to emit a phonon. The capture cross-section may be considered to be reduced from its low field (equilibrium) value $\sigma_o$ proportionately according to $$t_{tr}/t_{ph}: \sigma = \sigma_o \frac{r}{vt_{ph}}$$

The cross-section will be even further reduced by the effects of the high interface field since there will be a stron Poole-Frenkel lowering effect for a trap with a coulombic potential well. However, even ignoring this effect and using the typical numbers of $\sigma_o = 10^{-15}$ cm$^2$, r=1 angstrom, $\Delta E_c = 0.2$ eV we obtain $\sigma \approx 2 \times 10^{-20}$ cm$^2$. Therefore, assuming $N_{it} = 10^{12}$ cm$^{-2}$, the maximum attainable gain is $G_o = 5 \times 10^6$ and becomes progressively better the lower is $N_{it}$.

What is claimed is:

1. A solid state device comprising an interface between first and second regions having a first conductivity type, and adapted to the formation of an inversion layer at said interface, with said inversion layer being in electrical contact with a source of electrical carriers of a second conductivity type and adapted to control electrical carriers of said first conductivity type flowing between said first and second regions.

2. A device comprising:
   a metallic emitter in ohmic contact with a first region of a material having a given bandgap and of a first conductivity type;
   a second region of a material having a bandgap less than said given bandgap and also of said first conductivity type and contacting said first region at an interface;
   and a channel contact region having an opposite conductivity type as said first conductivity type, wherein said channel contact region is adapted to electrically contact an inversion layer formed at said interface.

3. The device of claim 2, wherein said inversion layer extends substantially to the outer limits of said interface in the absence of operating electrical potentials applied to said device.

4. The device of claim 2 wherein the formation of said inversion layer is accomplished at least in part by the presence of charged particles in the vicinity of said interface.

5. The device of claim 4 wherein said charged particles are deposited ions.

6. The device of claim 4 wherein said charged particles are located substantially in said first region.

7. The device of claim 4 wherein said charged particles are located substantially in said second region.

8. The device of claim 2 wherein said metallic emitter and said first region are optically transparent.

9. The device of claim 2 wherein said second region is adapted to produce hole-electron pairs when at least a portion of said device is illuminated by optical energy, whereby a photodetector is obtained.

10. The device of claim 9 wherein said device is adapted to provide current gain for the photo current resulting from the production of said hole-electron pairs.

11. The device of claim 2 wherein said channel contact is adapted to communicate with an electrical signal for controlling the flow of majority carriers transiting through said first region from said metallic emitter to said second region, and thereby provide current gain for said signal.

12. The device of claim 2 wherein said metallic emitter is a metal.

13. The device of claim 2 wherein said metallic emitter is a metal silicide.

14. The device of claim 2 wherein said metallic emitter is a degenerately doped semiconductor.

15. The device of claim 2 wherein said second region is formed in a substrate.

16. The device of claim 2 wherein said first region is formed in a substrate.

17. The device of claim 2 wherein said second region in the vicinity of said interface is a doped semiconductor having a bandgap between the valence and conduction bands in the range of 0.8 to 2.0 electron volts.

18. The device of claim 1 wherein said first region in the vicinity of said interface is a material having a bandgap between the valence and conduction bands in the range of 1.0 to 2.5 electron volts.

19. The device of claim 2 wherein said second region substantially comprises silicon.

20. The device of claim 2 wherein said second region substantially comprises at least one element selected from group III of the periodic table, and at least one element selected from group V of the periodic table.

21. The device of claim 2 wherein said first region substantially comprises silicon and oxygen.

22. The device of claim 3 wherein said first region substantially comprises at least one element selected from group III of the periodic table, and at least one element selected from group V of the periodic table.

23. The device of claim 2 wherein the majority electrical carriers in said first and second regions are electrons, whereby said conductivity type is n-type.

24. The device of claim 3 wherein the majority electrical carriers in said first and second regions are holes, whereby said conductivity type is p-type.

25. The device of claim 2 wherein said inversion layer subsists in the absence of operating electrical potentials applied to said regions.

26. The device of claim 2 wherein said inversion layer is formed at least in part by the application to said first, second, and channel contact regions of operating electrical potentials.

27. The device of claim 2 wherein said channel contact region electrically contacts said inversion layer in the absence of electrical potentials applied to said regions.

28. The device of claim 2 wherein said channel contact region electrically contacts said inversion layer upon the application of operating electrical potentials to said first and second regions.

29. The device of claim 2 wherein said first conductivity type is n-type, and wherein the Fermi level in said inversion layer is less than 0.2 electron volts more positive than the energy of the valence bend in said inversion layer when said device is in the quiescent state.

30. The device of claim 2 wherein said first conductivity type is p-type, and wherein the Fermi level in said inversion layer is less then 0.2 electron volts more negative than the energy of the conduction band in said inversion layer when said device is in the quiescent state.

31. The device of claim 2 wherein the maximum density of majority carriers in said inversion layer is at least $10^{17}$ carriers/cm$^3$.

32. The device of claim 2 wherein the maximum density of majority carriers in said inversion layer is at least $10^{18}$ carriers/cm$^3$.

33. The device of claim 2 wherein said inversion layer extends to a depth of less then 50 angstroms into said second region from said interface, when said device is in the quiescent state.

34. The device of claim 2 wherein the density of electrical carriers in said inversion layer when operating electrical potentials are applied to said device is at least 10 times greater then the density of the electrical carriers in said inversion layer when said device is in the quiescent state.

35. The device of claim 2 wherein said second region and said channel contact region are formed in a common substrate, and are bounded by a common surface thereof.

36. The device of claim 35 wherein said first region contacts said second region at said surface.

37. The device of claim 2 wherein said first region and said channel contact region are formed in a common substrate, and are bounded by a common surface thereof.

38. The device of claim 37 wherein said second region contact said first region at said surface.

39. The device of claim 2 wherein the bandgap of said first region in the vicinity of said interface is at least 0.025 electron volts greater than the bandgap of said second region in the vicinity of said interface when said device is in the quiescent state.

40. The device of claim 2 wherein any neutral region in the vicinity of said interface through which said carriers flow has a thickness of less than 100 angstroms.

41. The device of claim 2 wherein any neutral region in the vicinity of said interface through which said carriers flow has a thickness of less than 30 angstroms.

42. The device of claim 2 wherein the atomic spacing of said wider bandgap material differs from the atomic spacing of said narrower bandgap material by at least 3 percent.

43. The device of claim 2 wherein the atomic spacing of said wider bandgap material differs from the atomic spacing of said narrower bandgap material by at least 5 percent.

44. The device of claim 2 wherein a depletion region subsists in said second region and which extends at least from said channel contact region to the limits of said interface in the absence of operating electrical potentials applied to said device.

45. The device of claim 2 wherein said device exhibits a current gain for majority carriers flowing between said first and second regions, as compared to a control current flowing in said channel contact, that is proportional to $(N_c/P_o)e^{\Delta E_v/kT}$.

46. The device of claim 2 wherein said device exhibits a current gain for majority carriers flowing between said first and second regions, as compared to a control current flowing in said channel contact, that is proportional to $(N_v/N_o)e^{\Delta E_c/kT}$.

47. The device of claim 2 further comprising a third region having said opposite conductivity type and contacting said second region at a p-n junction, and adapted to inject substantially more minority carriers into said second region across said junction than said second region injects into said third region, whereby a thyristor is obtained.

48. The device of claim 2 further comprising a third region having said opposite conductivity type and contacting said second region at a p-n junction, with said third region having a wider bandgap than said second region, whereby said device is adapted to emit optical energy.

49. The device of claim 2 wherein said first conductivity type is p-type, and $\Delta E_c > \Delta E_v$.

50. The device of claim 2 wherein said first conductivity type is n-type, and $\Delta E_v > \Delta E_c$.

51. The device of claim 1 wherein said inversion layer subsists in the absence of operating electrical potentials applied to said device.

52. The device of claim 1 wherein said inversion layer is substantially formed by the application of operating electrical potentials to said device.

* * * * *